United States Patent
Zhou et al.

(10) Patent No.: US 11,821,961 B2
(45) Date of Patent: Nov. 21, 2023

(54) METHOD FOR ELECTRICITY-RELATED SECURITY AWARENESS OF DISTRIBUTED POWER SUPPLY SYSTEMS CONSIDERING SPATIO-TEMPORAL DISTRIBUTION OF RAINSTORMS

(71) Applicant: Hunan University, Changsha (CN)

(72) Inventors: Bin Zhou, Changsha (CN); Ziqi Da, Changsha (CN); Zhikang Shuai, Changsha (CN); Lipeng Zhu, Changsha (CN); Cong Zhang, Changsha (CN); Jiayong Li, Changsha (CN); Yifang Jin, Changsha (CN)

(73) Assignee: Hunan University, Changsha (CN)

( * ) Notice: Subject to any disclaimer, the term of this patent is extended or adjusted under 35 U.S.C. 154(b) by 0 days.

(21) Appl. No.: 18/185,429

(22) Filed: Mar. 17, 2023

(65) Prior Publication Data

US 2023/0236266 A1    Jul. 27, 2023

(30) Foreign Application Priority Data

May 5, 2022   (CN) .......................... 202210478850.7

(51) Int. Cl.
*G01R 31/52*     (2020.01)
*G01R 27/26*     (2006.01)
(Continued)

(52) U.S. Cl.
CPC ......... *G01R 31/52* (2020.01); *G01R 27/2605* (2013.01); *G06Q 10/04* (2013.01);
(Continued)

(58) Field of Classification Search
CPC .... G01R 31/52; G01R 27/2605; G06Q 10/04; G06Q 50/06; H02J 3/381; H02J 2203/20; H02J 2300/24; H02S 50/10
See application file for complete search history.

(56) References Cited

U.S. PATENT DOCUMENTS

2012/0059527 A1*  3/2012  Beaston ............ H02J 13/00034
                                                         713/320

FOREIGN PATENT DOCUMENTS

CN    108898247 A    11/2018
CN    110728448 A    1/2020
(Continued)

OTHER PUBLICATIONS

Yu Ye et al., "High-risk Problem of Penetration Testing of Power Grid Rainstorm Disaster Artificial Intelligence Prediction System and Its Countermeasures", 2019 IEEE 3rd Conference on Energy Internet and Energy System Integration (EI2), pp. 2675-2680.
(Continued)

*Primary Examiner* — Kidest Bahta

(57) ABSTRACT

A method for electricity-related security awareness of distributed power supply systems considering spatio-temporal distribution of rainstorms, including: establishing a multi-dimensional parallel parasitic capacitance calculation model of the distributed photovoltaic-energy storage power supply system considering accumulated water depth and micro-terrain environment; performing multi-source spatio-temporal hierarchical correlation analysis between rainstorm spatio-temporal distribution characteristics (including rainfall peak position, cloud movement, rainfall intensity and rainfall duration) and an operating state of the distributed power supply system; constructing a leakage current probability prediction model considering unevenness and randomness of the rainstorm spatio-temporal distribution; and establishing an electricity-related security awareness model based on deep meta-learning.

3 Claims, 7 Drawing Sheets

(51) Int. Cl.
- *G06Q 50/06* (2012.01)
- *H02J 3/38* (2006.01)
- *G06Q 10/04* (2023.01)
- *H02S 50/10* (2014.01)

(52) U.S. Cl.
CPC .............. *G06Q 50/06* (2013.01); *H02J 3/381* (2013.01); *H02S 50/10* (2014.12); *H02J 2203/20* (2020.01); *H02J 2300/24* (2020.01)

(56) References Cited

FOREIGN PATENT DOCUMENTS

| | | | |
|---|---|---|---|
| CN | 210016425 U | * | 2/2020 |
| CN | 112308322 A | | 2/2021 |

OTHER PUBLICATIONS

Yuan-Yuan Liu et al., "Dynamic spatial-temporal precipitation distribution models for short-duration rainstorms in Shenzhen, China based on machine learning", Atmospheric Research, 237 (2020), pp. 1-12.

* cited by examiner

```
┌─────────────────────────────────────────────────────────────┐
│ Deriving a multi-dimensional parallel parasitic capacitance analysis │
│ model of a distributed photovoltaic-energy storage power supply │
│ system (DPSPSS) considering accumulated water depth and         │──S110
│ micro-terrain environment, to establish a leakage current calculation │
│ model of the DPSPSS under rainstorm conditions                  │
└─────────────────────────────────────────────────────────────┘
                              │
                              ▼
┌─────────────────────────────────────────────────────────────┐
│ Collecting and preprocessing dataset; dividing the dataset into a │
│ support set, a query set, a training set and a test set; where the │
│ dataset comprises an input parameter and an output parameter; │
│ the input parameter comprises a characteristic parameter of │
│ spatio-temporal distribution of rainstorm and a micro-terrain │
│ characteristic parameter of a location of the DPSPSS; the output │
│ parameter comprises a model fitting parameter and a micro-terrain │──S120
│ fitting parameter; the characteristic parameter of spatio-temporal │
│ distribution of rainstorm comprises rainfall peak position, │
│ cloudmovement, rainfall intensity, and rainfall duration; and the │
│ micro-terrain characteristic parameter comprises roof length, │
│ roof width, roof inclination angle, roof drainage rate, photovoltaic │
│ installation per unit area, photovoltaic installation inclination angle, │
│ and energy storage battery installation per unit area           │
└─────────────────────────────────────────────────────────────┘
                              │
                              ▼
┌─────────────────────────────────────────────────────────────┐
│ Analyzing spatio-temporal correlation between the characteristic │
│ parameter of spatio-temporal distribution of rainstorm in a │
│ to-be-tested area and the characteristic parameter of spatio-temporal │
│ distribution of rainstorm in a surrounding area; and selecting and │──S130
│ adding the characteristic parameters of spatio-temporal distribution │
│ of rainstorm with high correlation to a sample of the to-be-tested │
│ area to train the leakage current calculation model            │
└─────────────────────────────────────────────────────────────┘
                              │
                              ▼
┌─────────────────────────────────────────────────────────────┐
│ Establishing a leakage current probability prediction model of the │
│ DPSPSS considering unevenness and randomness of                 │
│ spatio-temporal distribution of rainstorm; and perceiving a leakage │──S140
│ current risk perception in the to-be-tested area through the leakage │
│ current calculation model and the leakage current probability   │
│ prediction model                                                │
└─────────────────────────────────────────────────────────────┘
```

FIG. 1

METHOD FOR ELECTRICITY-RELATED SECURITY AWARENESS OF DISTRIBUTED POWER SUPPLY SYSTEMS CONSIDERING SPATIO-TEMPORAL DISTRIBUTION OF RAINSTORMS

CROSS-REFERENCE TO RELATED APPLICATIONS

This application claims the benefit of priority from Chinese Patent Application No. 202210478850.7, filed on May 5, 2022. The content of the aforementioned application, including any intervening amendments thereto, is incorporated herein by reference in its entirety.

TECHNICAL FIELD

This application relates to power supply and energy storage systems, and more particularly to a method for electricity-related security awareness of distributed power supply systems considering spatio-temporal distribution of rainstorms.

BACKGROUND

Rainstorm disasters occurred frequently in China in the past several years. The spatial distribution and duration of rainstorms are random, which is characterized by complex spatio-temporal variation characteristics, such as uneven spatio-temporal distribution of rainfalls, numerous rainstorm centers, and frequent local heavy rainfall, thereby making the occurrence of waterlogging in the distributed power supply systems random. Water accumulation caused by waterlogging will cause the leakage current of the power supply system to rise and exceed a limit, thereby causing electric shock and other electricity-related security issues. With respect to the county's policy of promoting the pilot project of the distributed rooftop photovoltaic development, a large amount of distributed photovoltaic energy storage equipment is connected to the county-level power grid, aggravating the public electricity-related security issue associated with the distributed power supply systems.

The existing leakage current awareness technology does not consider the influence of water accumulated in extreme conditions (e.g., rainstorms) on the leakage current of the distributed power supply system, and also does not involve the multi-dimensional spatio-temporal correlation analysis of the spatio-temporal distribution characteristics of rainstorms and operating state characteristic parameters of the power supply system, failing to explore the relationship between meteorological factors and the electricity-related security risk. It has been rarely reported about the leakage current awareness technology under rainstorm conditions, and thus there is an urgent need to develop a method for electricity-related security awareness of distributed power supply systems considering spatio-temporal distribution of rainstorms, which is of great significance to ensure personal safety.

SUMMARY

An object of this application is to provide a method for electricity-related security awareness of distributed power supply systems considering spatio-temporal distribution of rainstorms, which solves the problem that the existing leakage current awareness technology does not consider the influence of accumulated water generated in rainstorm conditions on the leakage current of the distributed power supply system.

Technical solutions of this application are described as follows.

This application provides a method for electricity-related security awareness of distributed power supply systems considering spatio-temporal distribution of rainstorms, including:

(a) deriving a multi-dimensional parallel parasitic capacitance analysis model of a distributed photovoltaic-energy storage power supply system (DPSPSS) considering accumulated water depth and micro-terrain environment, to establish a leakage current calculation model of the DPSPSS under rainstorm conditions;

(b) collecting and preprocessing a dataset; dividing the dataset into a support set, a query set, a training set and a test set; wherein the dataset includes an input parameter and an output parameter; the input parameter includes a characteristic parameter of spatio-temporal distribution of rainstorm and a micro-terrain characteristic parameter of a location of the DPSPSS; the output parameter includes model fitting parameters and micro-terrain fitting parameters; the characteristic parameter of spatio-temporal distribution of rainstorm includes rainfall peak position, cloud movement, rainfall intensity, and rainfall duration; and the micro-terrain characteristic parameter includes a roof length, a roof width, a roof inclination angle, a roof drainage rate, photovoltaic installation per unit area, a photovoltaic installation inclination angle, and energy storage battery installation per unit area;

(c) performing spatio-temporal correlation analysis between a characteristic parameter of spatio-temporal distribution of rainstorm of a to-be-tested area and characteristic parameters of spatio-temporal distribution of rainstorm of surrounding areas; and selecting a characteristic parameter of spatio-temporal distribution of rainstorm of a surrounding area with high correlation followed by adding to a sample of the to-be-tested area to train the leakage current calculation model; and (d) establishing a leakage current probability prediction model of the DPSPSS considering nonuniformity and randomness of spatio-temporal distribution of rainstorm; and performing leakage current risk perception in the to-be-tested area through the leakage current calculation model and the leakage current probability prediction model;

wherein the step (d) includes:

establishing an electricity-related security awareness model of the DPSPSS based on deep meta-learning;

with the dataset as a training sample, dividing the training sample into different subtask samples according to spatio-temporal distribution; and pre-training the electricity-related security awareness model by using the subtask samples;

updating weight parameters and bias parameters of a training model according to spatio-temporal correlation of weight parameters and bias parameters obtained by pre-training;

training the training model based on the weight parameters and bias parameters obtained by pre-training to obtain the leakage current probability prediction model; and according to the leakage current calculation model, obtaining a critical water depth corresponding to individual leakage current levels of the DPSPSS in the to-be-tested area; and inputting the critical water depth into the leakage current probability prediction model to identify a spatio-temporal distribution of electricity-related security risks of the DPSPSS in the to-be-tested area;

In an embodiment, the step (a) further includes:
(a1) deriving the multi-dimensional parallel parasitic capacitance analysis model; and
(a2) based on the multi-dimensional parallel parasitic capacitance analysis model, establishing the leakage current calculation model;

In an embodiment, the step (a1) includes:
(a11) obtaining a first parasitic capacitance model considering a depth of accumulated water on a surface of a photovoltaic cell and a depth of accumulated water between the photovoltaic cell and a first frame, wherein calculation formulas of the first parasitic capacitance model are listed as follows:

$$C_f^r = (2L_P + 2W_P - 4L_e) \cdot C_f \cdot \frac{S_P - S_w}{S_p} + \frac{C_b' \cdot C_E'}{C_b + C_E};$$

$$C_f = C_1 + C_2 + C_3 + C_4 + C_5;$$

$$C_1 = \frac{\varepsilon_0 \varepsilon_b}{\pi} \ln\left(1 + \frac{W_1}{a_{c1} + b_{c1}}\right) + \frac{\varepsilon_0 \varepsilon_b}{\pi} \ln\left(2k_{c1}\sqrt{k_{c1}^2 - 1} + 2k_{c1} - 1\right);$$

$$a_{c1} = T_{s1} + T_b + T_E;$$

$$b_{c1} = H_t;$$

$$k_{c1} = 1 + \frac{H_t}{T_{s1} + T_b + T_E};$$

$$C_2 = \frac{\varepsilon_0 \varepsilon_b}{\pi} \ln\left(2k_{c2}\sqrt{k_{c2}^2 - 1} + 2k_{c2} - 1\right);$$

$$k_{c2} = 1 + \frac{L_e}{L_s + W_3};$$

$$C_3 = \frac{\varepsilon_0 \varepsilon_a}{\pi} \ln\left(2k_{c31}\sqrt{k_{c31}^2 - 1} + 2k_{c31} - 1\right) + \frac{\varepsilon_0 \varepsilon_a}{\pi} \ln\left(2k_{c32}\sqrt{k_{c32}^2 - 1} + 2k_{c32} - 1\right);$$

$$k_{c31} = 1 + \frac{H_P}{T_E + T_e + T_{s1}};$$

$$k_{c32} = 1 + \frac{H_t}{T_E + T_e + T_{s1}};$$

$$C_4 = \frac{\varepsilon_0 \varepsilon_{qs1}}{\pi} \ln\left(2k_{c4}\sqrt{k_{c4}^2 - 1} + 2k_{c4} - 1\right);$$

$$\varepsilon_{qs1} = \frac{d_{w1}}{H_4}\varepsilon_w + \frac{H_4 - d_{w1}}{H_4}\varepsilon_a;$$

$$k_{c4} = 1 + \frac{L_e}{L_s};$$

$$C_5 = \frac{\dfrac{\varepsilon_0 \varepsilon_a W_5}{a_{c5} - d_{w1}} \cdot \dfrac{\varepsilon_0 \varepsilon_w W_5}{d_{w1}}}{\dfrac{\varepsilon_0 \varepsilon_a W_5}{a_{c5} - d_{w1}} + \dfrac{\varepsilon_0 \varepsilon_w W_5}{d_{w1}}};$$

$$a_{c5} = T_E + T_e + T_{s1} + H_t + H_4;$$

$$C_b' = \frac{\varepsilon_0 \varepsilon_b S_w}{T_b};$$

$$C_E' = \frac{\varepsilon_0 \varepsilon_E S_w}{T_E}; \text{ and}$$

$$S_P = L_P \cdot W_P;$$

wherein $C_f^r$ is a capacitance between the photovoltaic cell and a frame assembly under the rainstorm conditions; $C_f$ is a parasitic capacitance between the photovoltaic cell and the frame assembly without considering the accumulated water on the surface of the photovoltaic cell; the frame assembly includes the first frame, a second frame, a third frame, a fourth frame, and a fifth frame; $C_1$ is a parasitic capacitance between the photovoltaic cell and the fifth frame; $C_2$ is a parasitic capacitance between the photovoltaic cell and the second frame; $C_3$ is a parasitic capacitance between the photovoltaic cell and the third frame; $C_4$ is a parasitic capacitance between the photovoltaic cell and the fourth frame; $C_5$ is a parasitic capacitance between the photovoltaic cell and the first frame; $\varepsilon_0$ is absolute permittivity; $\varepsilon_a$ represents relative permittivity of air; $\varepsilon_b$ represents relative permittivity of glass; $\varepsilon_w$ represents relative permittivity of water; $\varepsilon_E$ represents relative permittivity of an ethyl vinyl acetate (EVA) layer; $T_e$ is a thickness of a Tedlar layer; $T_{s1}$ is a distance between the fifth frame and the glass; $T_b$ is a thickness of the glass; $T_E$ is a thickness of the EVA layer; $H_t$ is a thickness of the first frame, the second frame, the third frame, the fourth frame, or the fifth frame; $L_e$ is an effective length of a frame capacitor; $L_s$ is a distance from the photovoltaic cell to the third frame; $W_1$ is a length of the fifth frame; $W_3$ is a length of the third frame; $W_5$ is a length of the first frame overlapping with the photovoltaic cell; $H_p$ is a thickness of the photovoltaic cell; $H_4$ is a length of the fourth frame; $S_p$ is an area of the photovoltaic cell; $S_w$ is an area of the accumulated water on the surface of the photovoltaic cell; $C_b'$ is a capacitance between the EVA layer and the accumulated water on the surface of the photovoltaic cell; $C_E'$ is a capacitance between the photovoltaic cell and the glass when there is accumulated water on the surface of the photovoltaic cell; $L_p$ is a length of the photovoltaic cell; $W_p$ is a width of the photovoltaic cell; and $d_{w1}$ is the depth of the accumulated water between the first frame and the photovoltaic cell;

(a12) obtaining a second parasitic capacitance model considering a depth of accumulated water between the photovoltaic cell and a support frame, wherein calculation formulas of the second parasitic capacitance model are listed as follows:

$$C_r^r = \frac{(2L_P + 2W_P - 8W_r)C_{2E} \cdot C_{2e} \cdot C_{2A}' \cdot C_{2w}}{C_{r1} + C_{r2} + C_{r3} + C_{r4}};$$

$$C_{r1} = C_{2E} \cdot C_{2e} \cdot C_{2A}';$$

$$C_{r2} = C_{2E} \cdot C_{2e} \cdot C_{2w};$$

$$C_{r3} = C_{2E} \cdot C_{2A}' \cdot C_{2w};$$

$$C_{r4} = C_{2e} \cdot C_{2A}' \cdot C_{2w};$$

$$C_{2E} = \frac{\varepsilon_0 \varepsilon_E W_r}{T_E};$$

$$C_{2e} = \frac{\varepsilon_0 \varepsilon_e W_r}{T_e};$$

$$C_{2A}' = \frac{\varepsilon_0 \varepsilon_a W_r}{T_A - d_{w2}}; \text{ and}$$

$$C_{2w} = \frac{\varepsilon_0 \varepsilon_w W_r}{d_{w2}};$$

wherein $d_{w2}$ is the depth of the accumulated water between the photovoltaic cell and the support frame; $C_r^r$ is a parasitic capacitance between the photovoltaic cell and the support frame under the rainstorm conditions; $C_{2E}$ is a capacitance between a portion of the photovoltaic cell coinciding with the support frame and the Tedlar layer; $C_{2e}$ is a capacitance between the EVA layer of the portion of the photovoltaic cell coinciding with the support frame and an air layer; $C_{2A}'$ is a capacitance between the Tedlar layer and the air layer when there is accumulated water between the support frame and the photovoltaic cell; $C_{2w}$ is a capacitance between the air layer on the portion of the photovoltaic cell coinciding with the support frame and the support frame when there is accumulated water between the support frame and the photovoltaic cell; $\varepsilon_e$ is a relative permittivity of the Tedlar layer; $W_r$ is a width of the support frame; and $T_A$ is a thickness of the air layer between the Tedlar layer and the support frame;

(a13) obtaining a third parasitic capacitance model considering a depth of accumulated water between the photovoltaic cell and ground, wherein calculation formulas of the third parasitic capacitance model are listed as follows:

$$C_g^r = \frac{L_P \cdot C_E \cdot C_e \cdot C_A' \cdot C_{2w}}{C_{g1} + C_{g2} + C_{g3} + C_{g4}} + (2L_P + 2W_P - 4L_e)C_{rt};$$

$$C_{g1} = C_E \cdot C_e \cdot C_A';$$

$$C_{g2} = C_E \cdot C_e \cdot C_{3w};$$

$$C_{g3} = C_E \cdot C_A \cdot C_{3w};$$

$$C_{g4} = C_E . C_A . C_{3w}$$

$$C_A' = \frac{\varepsilon_0 \varepsilon_a W_P}{z - d_{w3}};$$

$$C_{3w} = \frac{\varepsilon_0 \varepsilon_w W_P}{d_{w3}};$$

$$C_{rt} = \frac{\varepsilon_0 \varepsilon_{qs3}}{\pi} \ln\left(1 + \frac{L_e}{T_E + T_e + z + H_P}\right); \text{ and}$$

$$\varepsilon_{qs3} = \frac{d_{w3}}{T_E + T_e + z + H_P} \varepsilon_w + \frac{T_E + T_e + z + H_P - d_{w3}}{T_E + T_e + z + H_P} \varepsilon_a;$$

wherein $d_{w3}$ is the depth of the accumulated water between the photovoltaic cell and the ground; $C_g^r$ is a capacitance between the photovoltaic cell and the ground under the rainstorm conditions; $C_E$ is the capacitance between the photovoltaic cell and the Tedlar layer; $C_e$ is the capacitance between the EVA layer and the air layer; $C_A'$ is a capacitance between the Tedlar layer and the ground when there is accumulated water between the photovoltaic cell and the ground; $C_{3w}$ is a capacitance between the air layer between the photovoltaic cell and the ground and the accumulated water on the ground; $C_{rt}$ is a capacitance between a top of the photovoltaic cell and the accumulated water; and z is a distance between the Tedlar layer and the ground;

(a14) obtaining a fourth parasitic capacitance model considering a depth of accumulated water between an energy storage battery and the ground, wherein calculation formulas of the fourth parasitic capacitance model are listed as follows:

$$C_e^r = C_{et}^r + C_{es}^r + C_{en}^r;$$

$$C_{et}^r = W_{es} \frac{\varepsilon_{qs4}}{\pi} \ln\left(1 + \frac{L_{es}}{a_{es} + b_{es}}\right);$$

-continued $$\varepsilon_{qs4} = \frac{d_{w4}}{a_{es} + b_{es}} \varepsilon_w + \frac{a_{es} + b_{es} - d_{w4}}{a_{es} + b_{es}} \varepsilon_a;$$

$$C_{es}^r = W_{es} \frac{\varepsilon_{qs4}}{\pi} \ln\left(2k_{es}\sqrt{k_{es}^2 - 1} + 2k_{es} - 1\right);$$

$$k_{es} = 1 + \frac{b_{es}}{a_{es}}; \text{ and}$$

$$C_{en}^r = W_{es} \frac{\frac{\varepsilon_a L_{es}}{a_{es} - d_{w4}} \cdot \frac{\varepsilon_w L_{es}}{d_{w4}}}{\frac{\varepsilon_a L_{es}}{a_{es} - d_{w4}} + \frac{\varepsilon_w L_{es}}{d_{w4}}};$$

wherein $c_e^r$ is a parasitic capacitance between the energy storage battery and the ground under the rainstorm conditions; $C_{et}^r$ is a parasitic capacitance between a top of the energy storage battery and the ground; $C_{es}^r$ is a parasitic capacitance between a side of the energy storage battery and the ground; $C_{en}^r$ is a parasitic capacitance between a bottom of the energy storage battery and the ground; $d_{w4}$ is a depth of the accumulated water between the energy storage battery and the ground; $L_{es}$ is a length of the top of the energy storage battery; $a_{es}$ is a distance between the energy storage battery and the ground; $b_{es}$ is a height of the side of the energy storage battery; and $W_{es}$ is a width of the energy storage battery;

In an embodiment, the step (a2) includes:

(a21) obtaining the leakage current calculation model generated between the photovoltaic cell or the energy storage battery and the ground, expressed as:

$$i_{c1} = i_{c2} = C_{P1}\frac{dU_{P1}}{dt} = C_{P2}\frac{dU_{P2}}{dt};$$

wherein $C_{P1}$ is an equivalent parasitic capacitance between a positive end of the photovoltaic cell or the energy storage battery and the ground; $C_{P2}$ is an equivalent parasitic capacitance between a negative end of the photovoltaic cell or the energy storage battery and the ground; $i_{c1}$ and $i_{c2}$ are both leakage currents; $U_{P1}$ is a voltage of $C_{P1}$; and $U_{P2}$ is a voltage of $C_{P2}$; and (a22) based on an expression of the high-frequency common-mode leakage current in combination with the first parasitic capacitance model, the second parasitic capacitance model, the third parasitic capacitance model, and the fourth parasitic capacitance model, establishing the leakage current calculation model, and obtaining an accumulated water depth $d_P$ when a leakage current of the DPSPSS exceeds $i_{Le}$.

In an embodiment, the step (c) includes:

(c1) performing a time series-based temporal correlation analysis on the input parameter through the following formulas:

$$C(R_a, R_b) = \frac{\text{cov}(R_a, R_b)}{\sigma(R_a)\sigma(R_b)};$$

$$R_a = [r_{a1}, r_{a2}, \ldots, r_{aN}] \text{ and}$$

$$R_b = [r_{b1}, r_{b2}, \ldots, r_{bN}];$$

wherein $R_a = [r_{a1}, r_{a2}, \ldots, r_{aN}]$ and $R_b = [r_{b1}, r_{b2}, \ldots, r_{bN}]$ represent values of the input parameter at different moments; $C(R_a, R_b)$ is a correlation coefficient between $R_a$ and $R_b$; $cov(R_a, R_b)$ is a covariance of $R_a$ and $R_b$; $\sigma(R_a)$ is a variance of $R_a$; and $\sigma(R_b)$ is a variance of $R_b$; and (c2) performing a geographic information-based spatial correlation analysis on the input parameter through the following formulas:

$$C(R_c, R_d) = \frac{cov(R_c, R_d)}{\sigma(R_c)\sigma(R_d)};$$

$$R_c = [r_{c1}, r_{c2}, \ldots, r_{cN}] \text{ and}$$

$$R_d = [r_{d1}, r_{d2}, \ldots, r_{dN}];$$

wherein $R_c=[r_{c1}, r_{c2}, \ldots, r_{cN}]$ and $R_d=[r_{d1}, r_{d2}, \ldots, r_{dN}]$ are values of the input parameter at different moments; $C(R_c, R_d)$ is a correlation coefficient of $R_c$ and $R_d$; $cov(R_c, R_d)$ is a covariance of $R_c$ and $R_d$; $\sigma(R_c)$ is a variance of $R_c$; and $\sigma(R_d)$ is a variance of $R_d$.

In an embodiment, the step (d) further includes:

obtaining a probability density function of the rainfall intensity, expressed as:

$$F(y_r) = \frac{\left[\frac{(t_r + C_r)^{A_r}}{D_r} y_r\right]^{\frac{1}{B_r}}}{B_r y_r};$$

wherein $A_r$, $B_r$, $C_r$, and $D_r$ are the model fitting parameters which are obtained by fitting historical data; $t_r$ is a predicted rainfall duration; and $y_r$ is the rainfall intensity;

according to rainfall spatio-temporal distribution characteristics and micro-terrain factors of different users, improving the probability density function to obtain a relationship between leakage probability of the DPSPSS and the accumulated water depth, expressed as:

$$y_r'' = (y_r' L_r W_r \cos\varphi_r - V_r) \cdot t_r; \text{ and}$$

$$y_r' = y_r^t k_t k_c;$$

wherein $y_r^t$ is a rainfall intensity of rainfall peak; $y_r'$ is an equivalent rainfall intensity which is a rainfall intensity in a specific area obtained according to the rainfall intensity of the rainfall peak; $y_r''$ is the accumulated water depth; $k_t$ is a fitting coefficient of the rainfall peak position; $k_c$ is a fitting coefficient of the cloud movement; $L_r$ is a fitting parameter to characterize the roof length; $W_r$ is a fitting parameter to characterize the roof width; $y_r$ is a fitting parameter to characterize the roof inclination angle; $V_r$ is a fitting parameter to characterize the roof drainage rate; and $k_t$, $k_c$, $L_r$, $W_r$, $\varphi_r$, and $V_r$ are the micro-terrain fitting parameters; obtaining a leakage current probability distribution function, expressed as:

$$F'(y_r') = \frac{\left[\frac{(t_r + C_r)^{A_r}}{D_r}(y_r' L_r W_r \cos\varphi_r - V_r) \cdot t_r\right]^{\frac{1}{B_r}}}{B_r(y_r' L_r W_r \cos\varphi_r - V_r) \cdot t_r};$$

based on the leakage current probability distribution function, deriving the leakage current calculation model, wherein when the leakage current of the DPSPSS exceeds $i_{Le}$, a probability calculation model is expressed as follows:

$$P_r = 1 - \int_{-\infty}^{\frac{d_P L_r W_r}{t_r} + V_r}_{L_r W_r \cos\varphi_r} F'(y_r') d(y_r');$$

wherein $d_P$ represents the accumulated water depth when the leakage current of the DPSPSS exceeds $i_{Le}$;

establishing the electricity-related security awareness model based on deep meta-learning; and integrating classification results of a classifier module of a light gradient boosting machine (LGBM) with output results of a deep dense neural network to output a prediction result of an operating state of the DPSPSS, expressed as:

$$O = \overset{m}{\underset{j=1,e=1}{a}} P_j G_e;$$

wherein O is the prediction result of the operating state of the DPSPSS; $P_j$ represents a j-th output result of the deep dense neural network; $G_e$ represents an e-th output result of the classifier module of the LGBM; m is number of samples; and input data of the classifier module of the LGBM is preprocessed characteristic parameters of spatio-temporal distribution of rainstorm;

wherein weights and biases in the deep dense neural network are updated in a gradient descent manner, and update rules are expressed as follows:

$$W_{fg}^{(s)} = W_{fg}^{(s)} - \alpha \frac{\alpha}{\alpha W_{fg}^{(s)}} L(W, b); \text{ and}$$

$$b_f^{(s)} = b_f^{(s)} - \alpha \frac{\alpha}{\alpha b_f^{(s)}} L(W, b);$$

wherein $W_{fg}^{(s)}$ represents a weight from a g-th neuron of a (s−1)-th layer to a f-th neuron of a s-th layer in the deep dense neural network; $b_f^{(s)}$ represents a bias of the f-th neuron of the s-th layer in the deep dense neural network; $\alpha$ represents learning rate; and $L(W, b)$ is a loss function which is expressed as follows:

$$L(W, b) = \frac{1}{N} \sum_{k=1}^{N} \frac{1}{2} \left\| h_{W,b}(x^{(k)}) - y^{(k)} \right\|^2;$$

wherein N is the number of samples in a training set; $x^{(k)}$ represents an input of a k-th sample of the training set in the deep dense neural network; $h_{W,b}(x)$ is a forward propagation function; and $y^{(k)}$ is a label of the k-th sample in the training set;

training the electricity-related security awareness model by deep meta-learning;

dividing the support set and the query set in the dataset into t subtask samples according to data in t different regions;

training the t subtask samples separately to obtain a corresponding weight parameter $W_t$ and a corresponding bias parameter $b_t$;

updating the weight parameters $W_m$ and bias parameters $b_m$ in the electricity-related security awareness model by soft update every time one of the t subtask samples is trained, wherein the soft update is expressed as follows:

$$W_{m(t)} = (1-\tau)W_{m(t-1)} + \tau(c_{w1}W_1 + c_{w2}W_2 + \ldots + c_{wt}W_t);$$
and $$b_{m(t)} = (1-\tau)b_{m(t-1)} + \tau(C_{w1}b_1 + c_{w2}b_2 + \ldots + c_{wt}b_t);$$

wherein $W_{m(t)}$ is a weight parameter of the training model obtained after a t-th subtask sample is trained; $b_{m(t)}$ is a bias parameter of the training model obtained after the t-th subtask sample is trained; $W_{m(t-1)}$ is a weight parameter of the training model obtained after a (t-1)-th subtask sample is trained; $b_{m(t-1)}$ is a bias parameter of the training model obtained after the (t-1)-th subtask sample is trained; $\tau$ is a soft update coefficient, and equals to 0.05; $W_1$, $W_2$, ..., and $W_t$ are weight parameters of the t subtask samples, respectively; $b_1$, $b_2$, ..., and $b_t$ are bias parameters of the t subtask samples, respectively; and $c_{w1}$, $c_{w2}$, ..., and $c_{wt}$ are correlation coefficients obtained by the spatio-temporal correlation analysis;

assigning the weight parameters $W_m$ and the bias parameters $b_m$ obtained by pre-training to the training model; and inputting the training set into the training model for training; outputting the model fitting parameters and the micro-terrain fitting parameters, so as to obtain the leakage current probability prediction model in different regions at different moments; and plugging the critical water depth obtained according to the leakage current calculation model into the leakage current probability prediction model, so as to identify the spatio-temporal distribution of electricity-related security risks of the DPSPSS.

Compared to the prior art, this application has the following beneficial effects.

The electricity-related security awareness method provided herein for the distributed power supply systems comprehensively considers the rainstorm spatio-temporal distribution characteristics (such as rainfall peak position, cloud movement, rainfall intensity, and rainfall duration) and micro-terrain information of different users (such as the roof width, roof length, roof inclination angle, roof drainage rate, photovoltaic installation per unit area, photovoltaic installation inclination angle, and energy storage battery installation per unit area). By improving the probability density function of the rainfall intensity, the leakage current probability prediction model of the DPSPSS is derived. A leakage current risk awareness technology for the DPSPSS is also developed herein. In summary, this method not only considers the influence of accumulated water generated in extreme rainstorm on the leakage current of the distributed photovoltaic-energy power supply storage system, but also considers the spatio-temporal distribution differences of different regions and the micro-terrain conditions of different users to perform the leakage probability prediction for the DPSPSS, allowing for more accurate and reliable prediction effect.

BRIEF DESCRIPTION OF THE DRAWINGS

The patent or application file contains FIGS. 2-5 and 9-11 executed in color. Copies of this patent or patent application publication with color drawing(s) will be provided by the Office upon request and payment of the necessary fee.

In order to illustrate the embodiments of the present disclosure or the technical solution more clearly in the prior art, the drawings required in the description of the embodiments or the prior art will be briefly described below. Obviously, presented in the drawings are merely some embodiments of the present disclosure, which are not intended to limit the disclosure. For those skilled in the art, other drawings may also be obtained according to the drawings provided herein without paying creative efforts.

FIG. 1 is a flowchart of a method for electricity-related security awareness of distributed power supply systems considering spatio-temporal distribution of rainstorms according to Embodiment 1 of the present disclosure;

Figure 2:
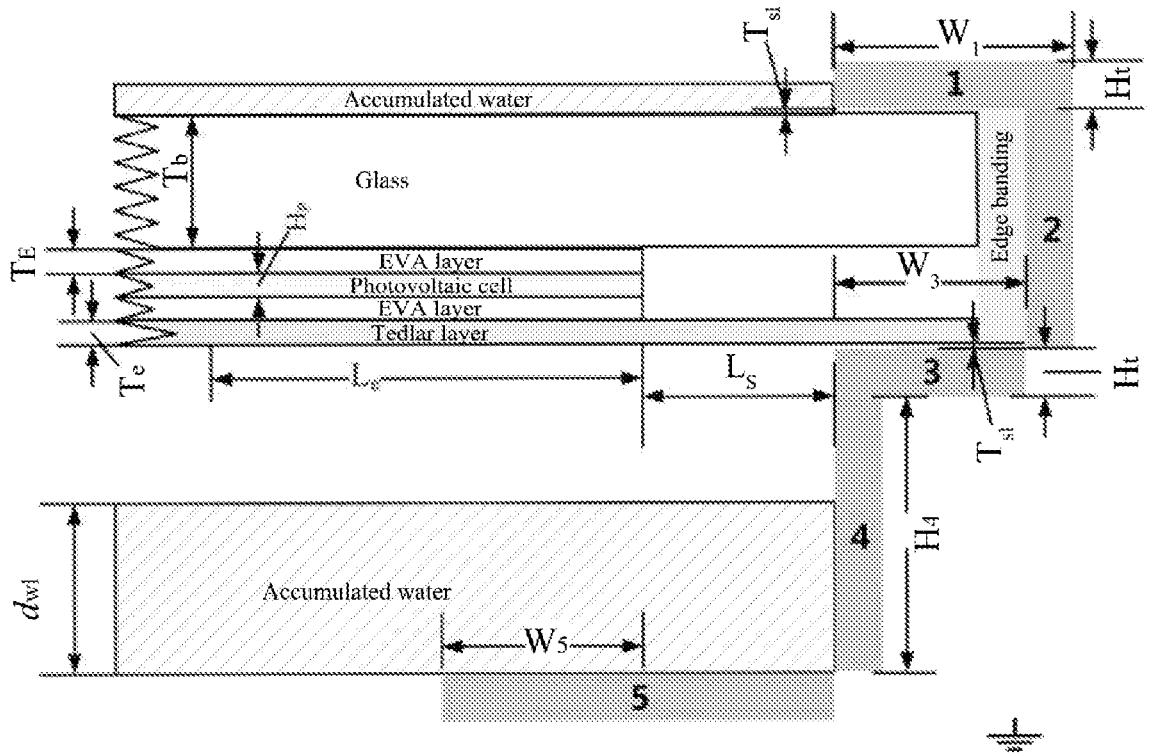
FIG. 2 schematically shows a parasitic capacitance between a photovoltaic cell and a frame in the electricity-related security awareness method according to Embodiment 4 of the present disclosure.
Figure 3A:
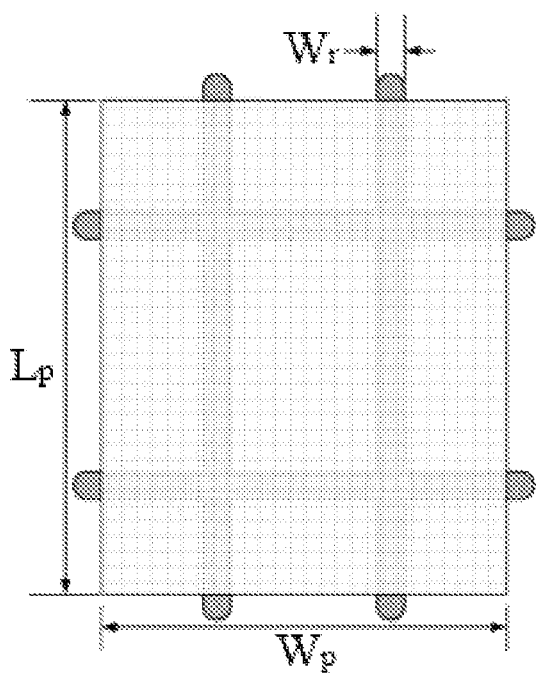
FIG. 3a is a top view of the photovoltaic cell according to Embodiment 4 of the present disclosure.
Figure 3B:
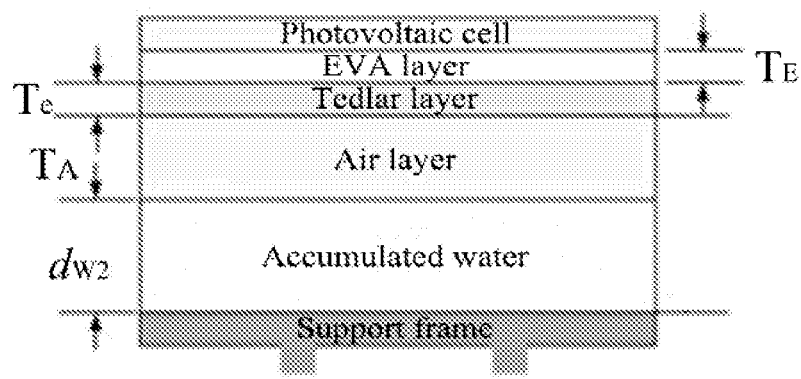
FIG. 3b is a cross-sectional view of the photovoltaic cell according to Embodiment 4 of the present disclosure.
Figure 4:
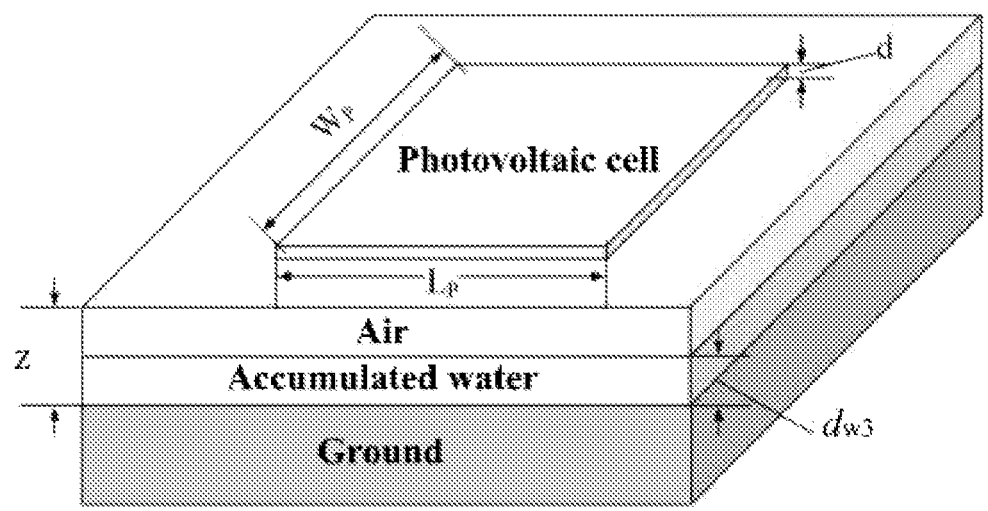
FIG. 4 schematically shows the parasitic capacitance between the photovoltaic cell and ground according to Embodiment 4 of the present disclosure.
Figure 5A:
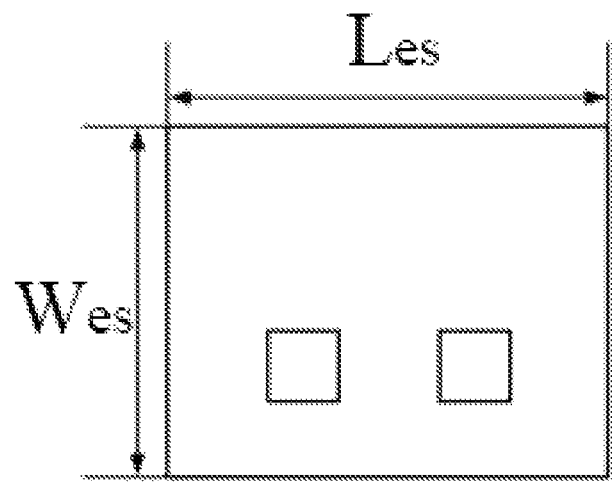
FIG. 5a is a top view of an energy storage battery according to Embodiment 4 of the present disclosure.
Figure 5B:
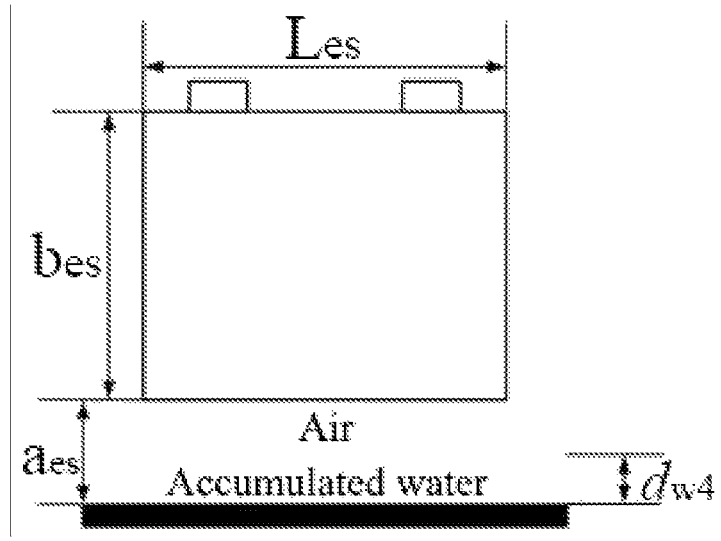
FIG. 5b is a side view of the energy storage battery according to Embodiment 4 of the present disclosure.

In the figures: 1—fifth frame; 2—second frame; 3—third frame; 4—fourth frame; and 5—first frame.

DETAILED DESCRIPTION OF EMBODIMENTS

It should be understood that the embodiments described herein are merely intended to explain the present disclosure, and are not intended to limit the present disclosure.

A method for electricity-related security awareness of distributed power supply systems considering spatio-temporal distribution of rainstorms is provided herein.

Embodiment 1

As shown in FIG. 1, the method for electricity-related security awareness of distributed power supply systems considering spatio-temporal distribution of rainstorms includes the following steps.

(S110) A multi-dimensional parallel parasitic capacitance analysis model of a distributed photovoltaic-energy storage power supply system (DPSPSS) considering accumulated water depth and micro-terrain environment is derived to establish a leakage current calculation model of the DPSPSS under rainstorm conditions.

In this embodiment, the DPSPSS includes the photovoltaic power generation system and the photovoltaic-energy storage system.

(S120) Dataset is collected, preprocessed, and divided into a support set, a query set, a training set and a test set. The dataset includes an input parameter and an output parameter. The input parameter includes a characteristic parameter of spatio-temporal distribution of rainstorm and a micro-terrain characteristic parameter of a location where the DPSPSS is disposed. The output parameter includes model fitting parameters and micro-terrain fitting parameters. The characteristic parameter of spatio-temporal distribution of rainstorm includes rainfall peak position, cloud movement, rainfall intensity, and rainfall duration. The micro-terrain characteristic parameter includes a roof length, a roof width, a roof inclination angle, a roof drainage rate, photovoltaic installation per unit area, a photovoltaic installation inclination angle, and energy storage battery installation per unit area.

Specifically, the model fitting parameters here are $A_r$, $B_r$, $C_r$, and $D_r$. The micro-terrain fitting parameters here are $k_r$, $k_c$, $L_r$, $W_r$, $\varphi_r$, and $V_r$, respectively. The preprocessing here is normalization processing. The support set and the query set are used for pre-training, and the training set and the test set are used for training and testing.

(S130) A spatio-temporal correlation analysis is performed between a characteristic parameter of spatio-temporal distribution of rainstorm of a to-be-tested area and characteristic parameters of spatio-temporal distribution of rainstorm of surrounding areas. A characteristic parameter of spatio-temporal distribution of rainstorm of a surrounding area with high correlation is selected and followed by adding to a sample of the to-be-tested area to train the leakage current calculation model. In an embodiment, the correlation between the characteristic parameter of spatio-temporal distribution of rainstorm of the to-be-tested area and the characteristic parameters of spatio-temporal distribution of rainstorm of surrounding areas is considered high when the correlation factor therebetween is equal to or higher than 0.8.

Specifically, after the type of the dataset is divided, the spatio-temporal correlation analysis of the input parameters is carried out. The number of the samples of each input characteristic parameter is adjusted according to the correlation, namely, the stronger the correlation, and the higher the proportion of the samples.

(S140) A leakage current probability prediction model of the DPSPSS considering nonuniformity and randomness of spatio-temporal distribution of rainstorm is established. The leakage current risk perception in the to-be-tested area through the leakage current calculation model and the leakage current probability prediction model is performed.

The electricity-related security awareness method provided herein for the distributed power supply systems comprehensively considers the rainstorm spatio-temporal distribution characteristics (such as rainfall peak position, cloud movement, rainfall intensity, and rainfall duration) and micro-terrain information of different users (such as the roof width, roof length, roof inclination angle, roof drainage rate, photovoltaic installation per unit area, photovoltaic installation inclination angle, and energy storage battery installation per unit area). By improving the probability density function of the rainfall intensity, the leakage current probability prediction model of the DPSPSS is derived. A leakage current risk perception technology for the DPSPSS is also developed herein. In summary, this method not only considers the influence of accumulated water generated in extreme rainstorm on the leakage current of the distributed photovoltaic-energy power supply storage system, but also considers the spatio-temporal distribution differences of different regions and the micro-terrain conditions of different users to perform the leakage current probability prediction for the DPSPSS, allowing for more accurate and reliable prediction effect.

Embodiment 2

This embodiment is based on Embodiment 1, and further, step (S140) includes the following steps.

(S210) An electricity-related security awareness model of the DPSPSS based on deep meta-learning is established.

(S220) With the dataset as a training sample, the training sample is divided into different subtask samples according to spatio-temporal distribution. The subtask samples are used to pre-train the electricity-related security awareness model.

(S230) The weight parameters and bias parameters of a training model according to spatio-temporal correlation of weight parameters and bias parameters obtained by pre-training are updated by soft update.

Specifically, the training model herein is the security awareness model that completes the pre-loop.

(S240) The training model is trained based on the weight parameters and the bias parameters obtained by pre-training, thereby obtaining the leakage current probability prediction model.

(S250) According to the leakage current calculation model, a critical water depth corresponding to individual leakage current levels of the DPSPSS in the to-be-tested area is obtained. The critical water depth is inputted into the leakage current probability prediction model to identify a spatio-temporal distribution of electricity-related security risks of the DPSPSS in the to-be-tested area.

In this embodiment, the disclosure also provides the electricity-related security awareness model based on meta-learning. The awareness model adopts the training method of meta-learning. The awareness model takes the rainstorm spatio-temporal distribution characteristics (such as the rainfall peak position, the cloud movement, the rainfall intensity, and the rainfall duration), and the micro-terrain information of different users (such as the roof width, roof length, roof inclination angle, roof drainage rate) as input. The awareness model takes the model fitting parameters and micro-terrain fitting parameters as output, to obtain the electricity-related security awareness model of the DPSPSS. The awareness model perceives the leakage current risk of the DPSPSS for users in different regions, realizing the hierarchical early warning of current leakage risk in different regions, which fills the technical gap of perceiving electricity-related security risk in the DPSPSS under rainstorm and severe weather.

Embodiment 3

This embodiment is based on Embodiment 1, further step (S110) includes the following steps.

(S310) The multi-dimensional parallel parasitic capacitance analysis model is derived.

(S320) Based on the multi-dimensional parallel parasitic capacitance analysis model, the leakage current calculation model is established.

(S330) Based on the leakage current calculation model, the leakage current probability prediction model is established.

Embodiment 4

Referring to FIGS. 2-5(b), this embodiment is based on Embodiment 3, further step (S310) includes the following steps.

(S410) A first parasitic capacitance model considering a depth of accumulated water on a surface of a photovoltaic cell and a depth of accumulated water between the photovoltaic cell and a first frame 5 is obtained. The calculation formulas of the first parasitic capacitance model formulas are listed as follows:

$$C_f^r = (2L_P + 2W_P - 4L_e) \cdot C_f \cdot \frac{S_P - S_w}{S_p} + \frac{C_b' \cdot C_E'}{C_b + C_E};$$

$$C_f = C_1 + C_2 + C_3 + C_4 + C_5;$$

$$C_1 = \frac{\varepsilon_0 \varepsilon_b}{\pi} \ln\left(1 + \frac{W_1}{a_{c1} + b_{c1}}\right) + \frac{\varepsilon_0 \varepsilon_b}{\pi} \ln\left(2k_{c1}\sqrt{k_{c1}^2 - 1} + 2k_{c1} - 1\right);$$

$$a_{c1} = T_{s1} + T_b + T_E;$$

$$b_{c1} = H_t;$$

$$k_{c1} = 1 + \frac{H_t}{T_{s1} + T_b + T_E};$$

$$C_2 = \frac{\varepsilon_0 \varepsilon_b}{\pi} \ln\left(2k_{c2}\sqrt{k_{c2}^2 - 1} + 2k_{c2} - 1\right);$$

$$k_{c2} = 1 + \frac{L_e}{L_s + W_3};$$

$$C_3 = \frac{\varepsilon_0 \varepsilon_a}{\pi} \ln\left(2k_{c31}\sqrt{k_{c31}^2 - 1} + 2k_{c31} - 1\right) + \frac{\varepsilon_0 \varepsilon_a}{\pi} \ln\left(2k_{c32}\sqrt{k_{c32}^2 - 1} + 2k_{c32} - 1\right);$$

$$k_{c31} = 1 + \frac{H_P}{T_E + T_e + T_{s1}};$$

$$k_{c32} = 1 + \frac{H_t}{T_E + T_e + T_{s1}};$$

$$C_4 = \frac{\varepsilon_0 \varepsilon_{qs1}}{jT} \ln\left(2k_{c4}\sqrt{k_{c4}^2 - 1} + 2k_{c4} - 1\right);$$

$$\varepsilon_{qs1} = \frac{d_{w1}}{H_4} \varepsilon_w + \frac{H_4 - d_{w1}}{H_4} \varepsilon_a;$$

$$k_{c4} = 1 + \frac{L_e}{L_s};$$

$$C_5 = \frac{\frac{\varepsilon_0 \varepsilon_a W_5}{a_{c5} - d_{w1}} \cdot \frac{\varepsilon_0 \varepsilon_w W_5}{d_{w1}}}{\frac{\varepsilon_0 \varepsilon_a W_5}{a_{c5} - d_{w1}} + \frac{\varepsilon_0 \varepsilon_w W_5}{d_{w1}}};$$

$$a_{c5} = T_E + T_e + T_{s1} + H_t + H_4;$$

$$C_b' = \frac{\varepsilon_0 \varepsilon_b S_w}{T_b};$$

$$C_E' = \frac{\varepsilon_0 \varepsilon_E S_w}{T_E}; \text{ and}$$

$$S_P = L_P \cdot W_P;$$

In the formulas above, $C_f^r$ is a capacitance between the photovoltaic cell and a frame assembly under the rainstorm conditions. $C_f$ is a parasitic capacitance between the photovoltaic cell and the frame assembly without considering the accumulated water on the surface of the photovoltaic cell. The frame assembly includes the first frame 5, a second frame 2, a third frame 3, a fourth frame 4, and a fifth frame 1. $C_1$ is a parasitic capacitance between the photovoltaic cell and the fifth frame 1. $C_2$ is a parasitic capacitance between the photovoltaic cell and the second frame 2. $C_3$ is a parasitic capacitance between the photovoltaic cell and the third frame 3. $C_4$ is a parasitic capacitance between the photovoltaic cell and the fourth frame 4. $C_5$ is a parasitic capacitance between the photovoltaic cell and the first frame 5. $\varepsilon_0$ is absolute permittivity. $\varepsilon_a$ represents relative permittivity of air. $\varepsilon_b$ represents relative permittivity of glass. $\varepsilon_w$ represents relative permittivity of water. $\varepsilon_E$ represents relative permittivity of an ethyl vinyl acetate (EVA) layer. $T_e$ is a thickness of a Tedlar layer. $T_{s1}$ is a distance between the fifth frame 1 and the glass. $T_b$ is a thickness of the glass. $T_E$ is a thickness of the EVA layer. $H_t$ represents a thickness of the first frame 5, the second frame 2, the third frame 3, the fourth frame 4, or the fifth frame 5. $L_e$ is an effective length of a frame capacitor. $L_s$ is a distance from the photovoltaic cell to the third frame 3. $W_1$ is a length of the fifth frame 1. $W_3$ is a length of the third frame. $W_5$ is a length of the first frame 5 overlapping with the photovoltaic cell. $H_p$ is a thickness of the photovoltaic cell. $H_4$ is a length of the fourth frame 4. $S_p$ is an area of the photovoltaic cell. $S_w$ is an area of the accumulated water on the surface of the photovoltaic cell. $C_b'$ is a capacitance between the EVA layer and the accumulated water on the surface of the photovoltaic cell. $C_E'$ is a capacitance between the photovoltaic cell and the glass when there is accumulated water on the surface of the photovoltaic cell. $L_p$ is a length of the photovoltaic cell. $W_p$ is a width of the photovoltaic cell. $d_{w1}$ is the depth of water between the first frame 5 and the photovoltaic cell.

Embodiment 5

This embodiment is based on Embodiment 4, further step (S410) includes the following steps.

(S510) A second parasitic capacitance model considering a depth of accumulated water between the photovoltaic cell and a support frame is obtained. The calculation formulas of the second parasitic capacitance model are listed as follows:

$$C_r^r = \frac{(2L_P + 2W_P - 8W_r)C_{2E} \cdot C_{2e} \cdot C_{2A}' \cdot C_{2w}}{C_{r1} + C_{r2} + C_{r3} + C_{r4}};$$

$$C_{r1} = C_{2E} \cdot C_{2e} \cdot C_{2A}';$$

$$C_{r2} = C_{2E} \cdot C_{2e} \cdot C_{2w};$$

$$C_{r3} = C_{2E} \cdot C_{2A}' \cdot C_{2w};$$

$$C_{r4} = C_{2e} \cdot C_{2A}' \cdot C_{2w};$$

-continued $$C_{2E} = \frac{\varepsilon_0 \varepsilon_E W_r}{T_E};$$

$$C_{2e} = \frac{\varepsilon_0 \varepsilon_e W_r}{T_e};$$

$$C'_{2A} = \frac{\varepsilon_0 \varepsilon_a W_r}{T_A - d_{w2}}; \text{ and}$$

$$C_{2w} = \frac{\varepsilon_0 \varepsilon_w W_r}{d_{w2}};$$

In the formulas above, $d_{w2}$ is the depth of the accumulated water between the photovoltaic cell and the support frame. $C_r^r$ is a parasitic capacitance between the photovoltaic cell and the support frame under the rainstorm conditions. $C_{2E}$ is a capacitance between a portion of the photovoltaic cell coinciding with the support frame and the Tedlar layer. $C_{2e}$ is a capacitance between the EVA layer of the portion of the photovoltaic cell coinciding with support frame and an air layer. $C_{2A}'$ is a capacitance between the Tedlar layer and the air layer when there is accumulated water between the support frame and the photovoltaic cell. $C_{2w}$ is a capacitance between the air layer on the portion of the photovoltaic cell coinciding with the support frame and the support frame when there is accumulated water between the support frame and the photovoltaic cell. $\varepsilon_0$ is the absolute permittivity. $\varepsilon_E$ is the relative permittivity of the EVA layer. $\varepsilon_e$ is a relative permittivity of the Tedlar layer. $\varepsilon_a$ is the relative permittivity of air. $\varepsilon_w$ is the relative permittivity of water. $W_r$ is a width of the support frame. $T_E$ is the thickness of the EVA layer. $T_e$ is the thickness of the Tedlar layer. $T_A$ is a thickness of the air layer between the Tedlar layer and the support frame. $L_p$ is the length of the photovoltaic cell. and $W_p$ is the width of the photovoltaic cell.

Embodiment 6

This embodiment is based on the Embodiment 5, further step (S520) includes the following steps.

(S610) A third parasitic capacitance model considering a depth of accumulated water between the photovoltaic cell and ground is obtained. The calculation formulas of the third parasitic capacitance model are listed as follows:

$$C_g^r = \frac{L_P \cdot C_E \cdot C_e \cdot C_A' \cdot C_{2w}}{C_{g1} + C_{g2} + C_{g3} + C_{g4}} + (2L_P + 2W_P - 4L_e)C_{rt};$$

$$C_{g1} = C_E \cdot C_e \cdot C_A';$$

$$C_{g2} = C_E \cdot C_e \cdot C_{3w};$$

$$C_{g3} = C_E \cdot C_A \cdot C_{3w}$$

$$C_{g4} = C_E \cdot C_A \cdot C_{3w};$$

$$C_A' = \frac{\varepsilon_0 \varepsilon_a W_P}{z - d_{w3}};$$

$$C_{3w} = \frac{\varepsilon_0 \varepsilon_w W_P}{d_{w3}};$$

$$C_{rt} = \frac{\varepsilon_0 \varepsilon_{qs3}}{\pi} \ln\left(1 + \frac{L_e}{T_E + T_e + z + H_P}\right); \text{ and}$$

$$\varepsilon_{qs3} = \frac{d_{w3}}{T_E + T_e + z + H_P} \varepsilon_w + \frac{T_E + T_e + z + H_P - d_{w3}}{T_E + T_e + z + H_P} \varepsilon_a.$$

In the formulas above, $d_{w3}$ is the depth of the accumulated water between the photovoltaic cell and the ground. $C_g r$ is a capacitance between the photovoltaic cell and the ground under the rainstorm conditions. $C_E$ is the capacitance between the photovoltaic cell and the Tedlar layer. $C_e$ is the capacitance between the EVA layer and the air layer. $C_A'$ is a capacitance between the Tedlar layer and the ground when there is accumulated water between the photovoltaic cell and the ground. $C_{3w}$ is a capacitance between the air layer between the photovoltaic cell and the ground and the accumulated water on the ground. $C_{rt}$ is a capacitance between a top of the photovoltaic cell and the accumulated water. $\varepsilon_0$ is the absolute permittivity. $\varepsilon_a$ is the relative permittivity of the air. $\varepsilon_w$ is the relative permittivity of water. $T_E$ is the thickness of the EVA layer. $T_e$ is the thickness of the Tedlar layer. z is a distance between the Tedlar layer and the ground. $W_p$ is the width of the photovoltaic cell. $L_e$ is the effective length for a frame capacitor. $H_p$ is the thickness of the photovoltaic cell.

Embodiment 7

This embodiment is based on Embodiment 6, further step (S430) includes the following steps.

(S710) A fourth parasitic capacitance model considering a depth of accumulated water between an energy storage battery and the ground is obtained. The calculation formulas of the fourth parasitic capacitance model are listed as follows:

$$C_e^r = C_{et}^r + C_{es}^r + C_{en}^r;$$

$$C_{et}^r = W_{es} \frac{\varepsilon_{qs4}}{\pi} \ln\left(1 + \frac{L_{es}}{a_{es} + b_{es}}\right);$$

$$\varepsilon_{qs4} = \frac{d_{w4}}{a_{es} + b_{es}} \varepsilon_w + \frac{a_{es} + b_{es} - d_{w4}}{a_{es} + b_{es}} \varepsilon_a;$$

$$C_{es}^r = W_{es} \frac{\varepsilon_{qs4}}{\pi} \ln\left(2k_{es}\sqrt{k_{es}^2 - 1} + 2k_{es} - 1\right);$$

$$k_{es} = 1 + \frac{b_{es}}{a_{es}}; \text{ and}$$

$$C_{en}^r = W_{es} \frac{\frac{\varepsilon_a L_{es}}{a_{es} - d_{w4}} \cdot \frac{\varepsilon_w L_{es}}{d_{w4}}}{\frac{\varepsilon_a L_{es}}{a_{es} - d_{w4}} + \frac{\varepsilon_w L_{es}}{d_{w4}}}.$$

In the formulas above, $C_e^r$ is a parasitic capacitance between the energy storage battery and the ground under the rainstorm conditions. $C_{et}^r$ is a parasitic capacitance between a top of the energy storage battery and the ground. $C_{es}^r$ is a parasitic capacitance between a side of the energy storage battery and the ground. $C_{en}^r$ is a parasitic capacitance between a bottom of the energy storage battery and the ground. $d_{w4}$ is a depth of the accumulated water between the energy storage battery and the ground. $L_{es}$ is a length of the top of the energy storage battery. $a_{es}$ is a distance between the energy storage battery and the ground. $b_{es}$ is a height of the side of the energy storage battery. $W_{es}$ is a width of the energy storage battery. $\varepsilon_0$ is the absolute permittivity. $\varepsilon_a$ is the relative permittivity of air. $\varepsilon_w$ is the relative permittivity of water.

Embodiment 8

This embodiment is based on Embodiment 7, further step (S320) further includes the following steps.

(S810) The leakage current calculation model, generated between the photovoltaic cell or the energy storage battery and the ground is expressed as:

$$i_{c1} = i_{c2} = C_{P1}\frac{dU_{P1}}{dt} = C_{P2}\frac{dU_{P2}}{dt}.$$

In the formula, C 1 is an equivalent parasitic capacitance between a positive end of the photovoltaic cell or the energy storage battery and the ground. $C_{P2}$ is an equivalent parasitic capacitance between a negative end of the photovoltaic cell or the energy storage battery and the ground. $i_{c1}$ and $i_{c2}$ are both leakage currents. $U_{P1}$ is a voltage of $C_{P1}$. $U_{P2}$ is a voltage of $C_{P2}$.

(S820) Based on an expression of the high-frequency common-mode leakage current in combination with the first parasitic capacitance model, the second parasitic capacitance model, the third parasitic capacitance model, and the fourth parasitic capacitance model, the leakage current calculation model is established, to obtain an accumulated water depth $d_P$ when a leakage current of the DPSPSS exceeds $i_{Le}$.

Embodiment 9

Figure 6:
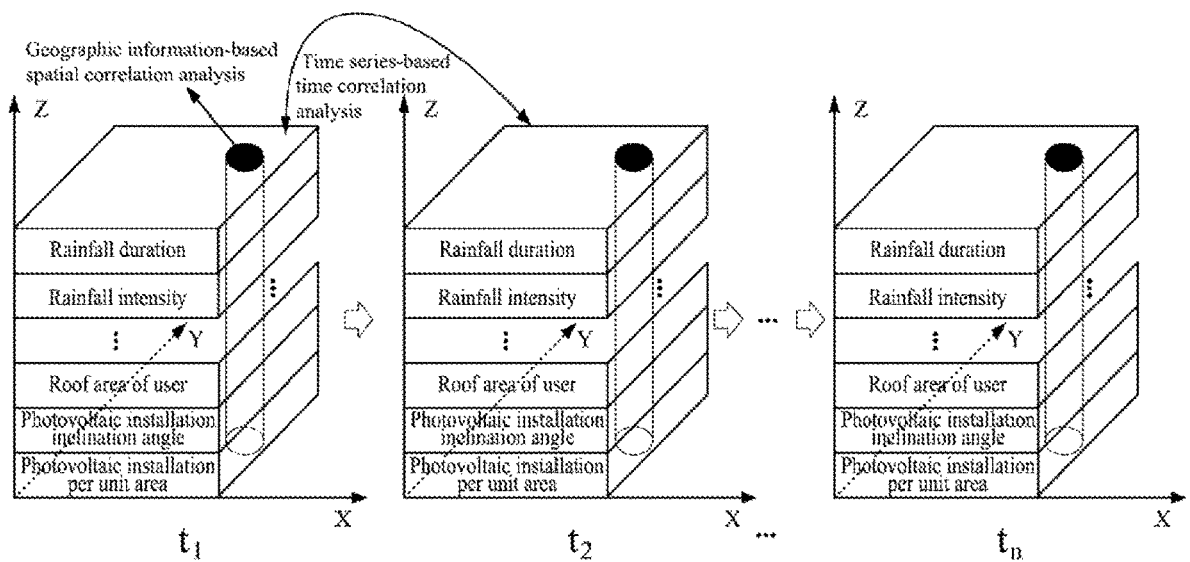
FIG. 6 is a schematic diagram of a spatio-temporal correlation analysis model in the electricity-related security awareness method according to Embodiment 9 of the present disclosure.

Referring to FIG. 6, this embodiment is based on Embodiment 8, further step (S130) includes the following steps.

(S910) A time series-based temporal correlation analysis on the input parameter is performed through the following formulas:

$$C(R_a, R_b) = \frac{\text{cov}(R_a, R_b)}{\sigma(R_a)\sigma(R_b)};$$

$$R_a = [r_{a1}, r_{a2}, \ldots, r_{aN}]; \text{ and}$$

$$R_b = [r_{b1}, r_{b2}, \ldots, r_{bN}].$$

In the formulas above, $R_a=[r_{a1}, r_{a2}, \ldots, r_{aN}]$ and $R_b=[r_{b1}, r_{b2}, \ldots, r_{bN}]$ represent values of the input parameters at different moments. $C(R_a, R_b)$ is a correlation coefficient between $R_a$ and $R_b$. $\text{cov}(R_a, R_b)$ is a covariance of $R_a$ and $R_b$. $\sigma(R_a)$ is a variance of $R_a$. $\sigma(R_b)$ is a variance of $R_b$.

(S1020) Geographic information-based spatial correlation analysis is performed on the input parameters through the following formulas:

$$C(R_c, R_d) = \frac{\text{cov}(R_c, R_d)}{\sigma(R_c)\sigma(R_d)};$$

$$R_c = [r_{c1}, r_{c2}, \ldots, r_{cN}]; \text{ and}$$

$$R_d = [r_{d1}, r_{d2}, \ldots, r_{dN}].$$

In the formulas above, $R_c=[r_{c1}, r_{c2}, \ldots, r_{cN}]$ and $R_d=[r_{d1}, r_{d2}, \ldots, r_{dN}]$ are values of the input parameters at different moments. $C(R_c, R_d)$ is a correlation coefficient of $R_c$ and $R_d$. $\text{cov}(R_c, R_d)$ is a covariance of $R_c$ and $R_d$. $\sigma(R_c)$ is a variance of $R_c$. $\sigma(R_d)$ is a variance of $R_d$.

Embodiment 10

This embodiment is based on Embodiment 9, further step (S140) includes the following steps.

(S1010) The probability density function of the rainfall intensity is expressed as:

$$F(y_r) = \frac{\left[\frac{(t_r + C_r)^{A_r}}{D_r} y_r\right]^{\frac{1}{B_r}}}{B_r y_r}.$$

$A_r$, $B_r$, $C_r$, and $D_r$ are the model fitting parameters obtained by fitting historical data. $t_r$ is a predicted rainfall duration. $y_r$ is the rainfall intensity.

(S1020) According to rainfall spatio-temporal distribution characteristics and micro-terrain factors of different users, the probability density function is improved to obtain a relationship between leakage probability of the DPSPSS and the depth of accumulated water, expressed as:

$$y_r'' = (y_r' L_r W_r \cos \varphi_r - V_r) \cdot t_r; \text{ and}$$

$$y_r' = y_r^t k_t k_c.$$

In the formulas above, $y_r^t$ is a rainfall intensity of rainfall peak. $y_r'$ is an equivalent rainfall intensity which is a rainfall intensity in a specific area obtained according to the rainfall intensity of the rainfall peak. $y_r''$ is the accumulated water depth. $k_t$ is a fitting coefficient of the rainfall peak position. $k_c$ is a fitting coefficient of the cloud movement. $L_r$ is a fitting parameter to characterize the roof length. $W_r$ is a fitting parameter to characterize the roof width. $\varphi_r$ is a fitting parameter to characterize the roof inclination angle. $V_r$ is a fitting parameter to characterize the roof drainage rate. $k_t$, $k_c$, $L_r$, $W_r$, $\varphi_r$, and $V_r$ are the micro-terrain fitting parameters.

Specifically, the leakage current of the photovoltaic-energy storage power supply system is related to the accumulated water depth.

(S1030) A leakage current probability distribution function is obtained and expressed as follows:

$$F'(y_r') = \frac{\left[\frac{(t_r + C_r)^{A_r}}{D_r}(y_r' L_r W_r \cos\varphi_r - V_r) \cdot t_r\right]^{\frac{1}{B_r}}}{B_r(y_r' L_r W_r \cos\varphi_r - V_r) \cdot t_r}.$$

(S1040) Based on the leakage current probability distribution function, the leakage current calculation model is derived. When the leakage current of the DPSPSS exceeds $i_{Le}$, a probability calculation model is expressed as follows:

$$P_r = 1 - \int_{-\infty}^{\frac{d_p L_r W_r}{t_r} + V_r}{L_r W_r \cos\varphi_r} F'(y_r') d(y_r').$$

In this formula, $d_P$ represents to the accumulated water depth when the leakage current of the DPSPSS exceeds $i_{Le}$.

Figure 7:
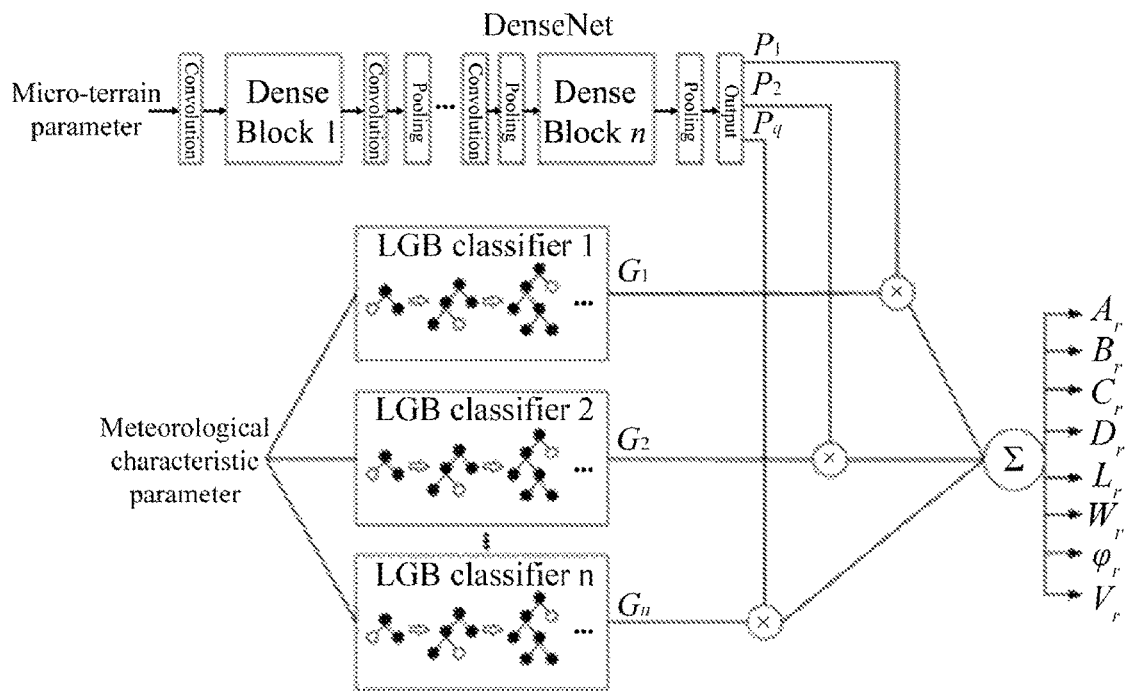
FIG. 7 is an electricity-related security awareness model for the distributed power supply systems under secondary disasters according to Embodiment 10 of the present disclosure.
Figure 8:
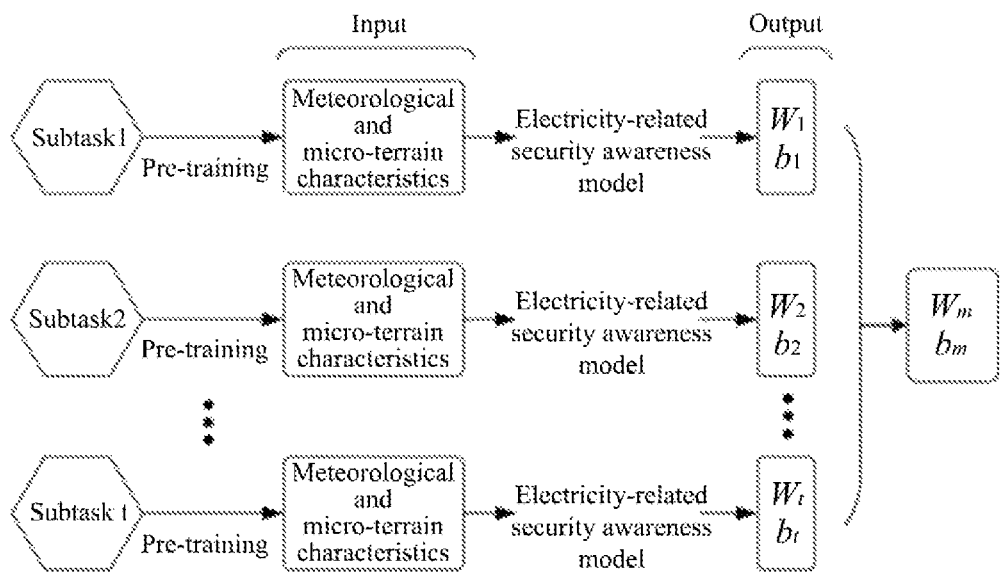
FIG. 8 is a flowchart of a Model-Agnostic Meta-Learning (MAML) pre-training method based on the electricity-related security awareness model according to Embodiment 10 of the present disclosure.

Specifically, the awareness model includes a classifier module of a light gradient boosting machine (LGBM) and a deep dense neural network module, as shown in FIG. 7. A schematic diagram of the meta-learning training method is shown in FIG. 8.

Specifically, the input data of the deep dense neural network is the preprocessed micro-terrain characteristic parameters. The output layer uses the Softmax function as the activation function. The output layer has a total of q neurons. The q output results of the deep dense neural network are $P_1, P_2, \ldots, P_q$. Softmax function is used as the activation function, the output results meet the following conditions:

$$P_1+P_2+L+P_q=1.$$

The input of the LGB subclassifier is the meteorological characteristic parameter after preprocessing, that is, the spatio-temporal distribution characteristic parameters of rainfall.

(S1050) The classification results of the classifier module of the light gradient boosting machine (LGBM) are integrated with output results of the deep dense neural network to output a prediction result of an operating state of the DPSPSS, expressed as:

$$W_{fg}^{(s)} = W_{fg}^{(s)} - \alpha \frac{\alpha}{\alpha W_{fg}^{(s)}} L(W, b); \text{ and}$$

$$b_f^{(s)} = b_f^{(s)} - \alpha \frac{\alpha}{\alpha b_f^{(s)}} L(W, b).$$

In this formula, O is the prediction result of the operating state of the DPSPSS. $P_j$ represents a j-th output result of the deep dense neural network. $G_e$ represents an e-th output result of the classifier module of the LGBM. m is number of samples. Input data of the classifier module of the LGBM is preprocessed characteristic parameters of spatio-temporal distribution of rainstorm.

The weights and biases in the deep dense neural network are updated in a gradient descent manner. The update rules are as follows:

$$L(W, b) = \frac{1}{N} \sum_{k=1}^{N} \frac{1}{2} \left\| h_{W,b}(x^{(k)}) - y^{(k)} \right\|^2.$$

In the formulas above, $W_{fg}^{(s)}$ represents a weight from a g-th neuron of a (s−1)-th layer to a f-th neuron of a s-th layer in the deep dense neural network. $b_f^{(s)}$ represents a bias of the f-th neuron of the s-th layer in the deep dense neural network. α represents learning rate. L(W, b) is a loss function which is expressed as follows:

$$O = \overset{m}{\underset{j=1,e=1}{a}} P_j G_e.$$

In the formula above, N is the number of samples in a training set. $x^{(k)}$ represents an input of a k-th sample of the training set in the deep dense neural network. $h_{W,b}$ (x) is a forward propagation function. $y^{(k)}$ is a label of the k-th sample in the training set.

(S1060) The deep meta-learning is used to train the electricity-related security risk awareness model, as shown in FIG. 8.

(S1070) The support set and query set in the dataset are divided into t subtask samples according to data in t different regions.

(S1080) The t subtask samples are trained separately to obtain a corresponding weight parameter $W_t$ and a corresponding bias parameter $b_t$.

(S1090) The weight parameters $W_m$ and the bias parameters $b_m$ in the electricity-related security awareness model are updated by the soft update every time one of the t subtask samples is trained, wherein the soft update is expressed as follows:

$$W_{m(t)}=(1-t\tau)W_{m(t-1)}+\tau(c_{w1}W_1+c_{w2}W_2+\ldots+c_{wt}W_t);$$
and $$b_{m(t)}=(1-t\tau)b_{m(t-1)}+\tau(C_{w1}b_1+c_{w2}b_2+\ldots+c_{wt}b_t).$$

In the formulas above, $W_{m(t)}$ is a weight parameter of the training model obtained after a t-th subtask sample is trained. $b_{m(t)}$ is a bias parameter of the training model obtained after the t-th subtask sample is trained. $W_{m(t-1)}$ is a weight parameter of the training model obtained after a (t−1)-th subtask sample is trained. $b_{m(t-1)}$ is a bias parameter of the training model obtained after the (t−1)-th subtask sample is completed. τ is a soft update coefficient and equals to 0.05. $W_1, W_2, \ldots,$ and $W_t$ are weight parameters of the t subtask samples, respectively. $b_1, b_2, \ldots,$ and $b_t$ are bias parameters for each of the t subtask samples, respectively. $c_{w1}, c_{w2}, \ldots,$ and $c_{wt}$ are correlation coefficients obtained by the spatio-temporal correlation analysis.

(S1091) The pre-trained weight parameters $W_m$ and the bias parameters $b_m$ are assigned to the training model.

(S1092) The training set is inputted into the training model for training. The model fitting parameters and the micro-terrain fitting parameters are outputted, so as to obtain the leakage current probability prediction model in different regions at different moments. The critical water depth obtained according to the leakage current calculation model is substituted into the leakage current probability prediction model, so as to identify the spatio-temporal distribution of electricity-related security risks of the DPSPSS.

Embodiment 11

This embodiment is based on Embodiment 10, further step (S1091) includes the following steps.

(S1110) The training model is used for panoramic awareness of electricity-related potential security risks in the DPSPSS. The training model is programmed in Python according to the process of the first embodiment of the present disclosure.

The actual test area is divided into N*N grids varying in the meteorological data and terrain factor. The rainfall meteorological data in each grid also vary over time. Thus, the grids under different spatial and temporal conditions correspond to different probability density functions of the rainfall intensity.

Then, according to the parasitic capacitance of the DPSPSSs, the critical rainfall intensity (120 mm for 12 h in this disclosure) under which the leakage currents of the DPSPSSs in different grids will exceed 300 mA to trigger the electricity-related safety risk is obtained. The critical rainfall intensity is plugged into the probability density function of individual grids, thereby obtaining the probability of the grids varying in spatial and temporal parameters that the leakage current of the DPSPSSs exceeds the critical value under rainstorm conditions to cause the electricity-related security risk.

Figure 9:
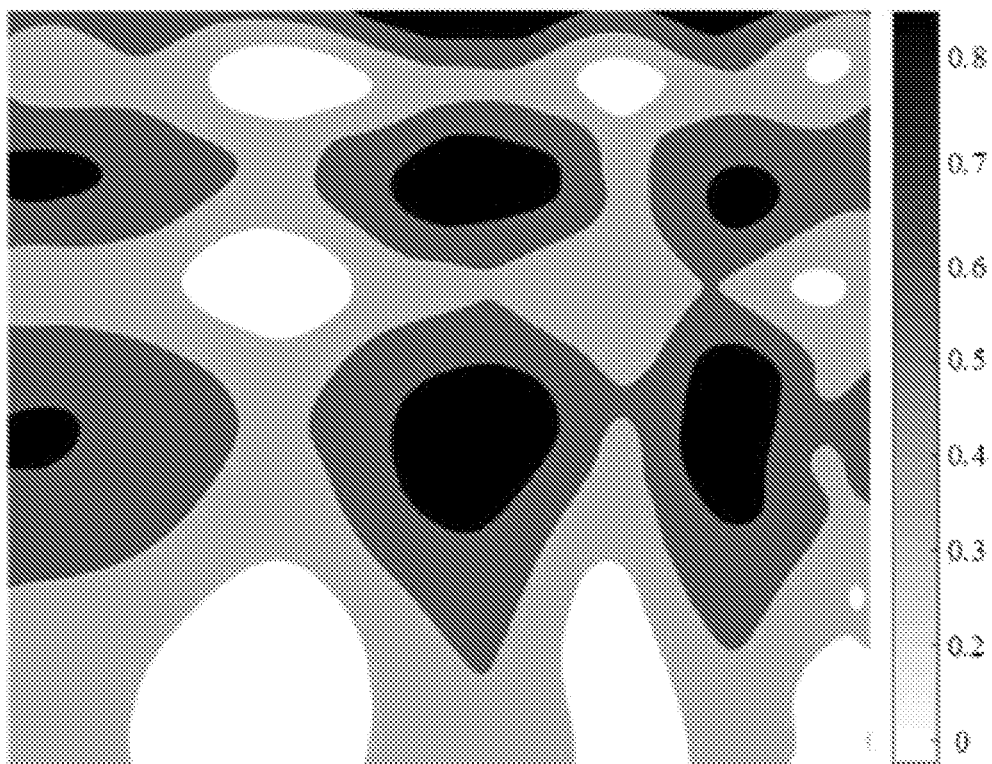
FIG. 9 shows prediction results obtained by the electricity-related security awareness method according to Embodiment 11 of the present disclosure, where the rainfall duration is 12 h; the rainfall intensity is 120 mm/h; and the leakage current of each site in the test area exceeds 300 mA.
Figure 10:
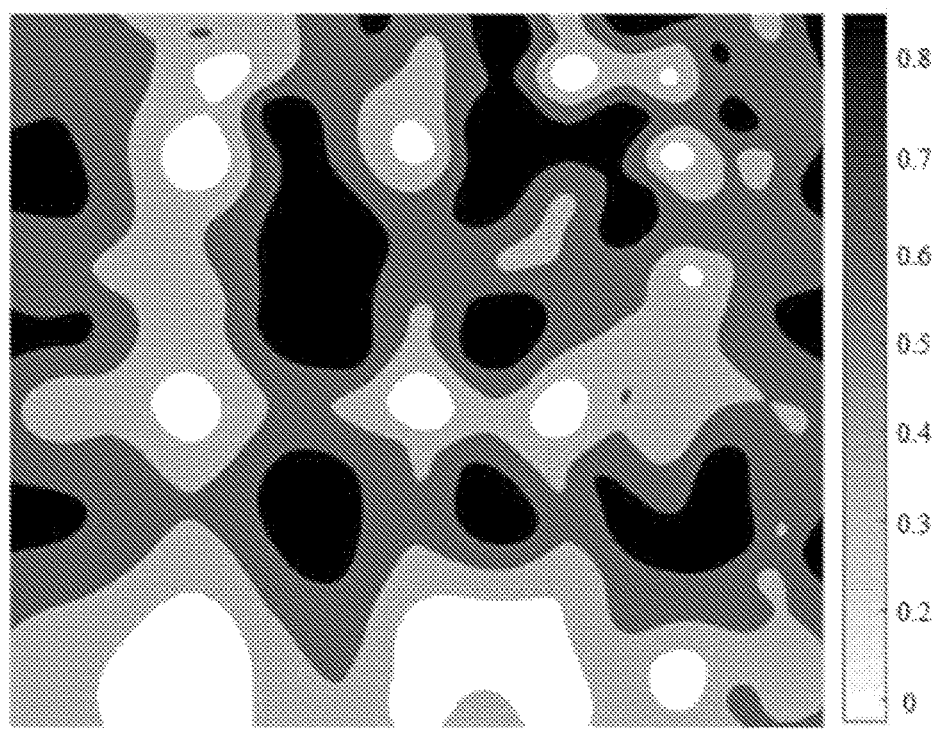
FIG. 10 shows prediction results obtained by the electricity-related security awareness method according to Embodiment 11 of the present disclosure, where the rainfall duration is 24 h; the rainfall intensity is 120 mm/h; and the leakage current exceeds 300 mA at each site in the test area.
Figure 11:
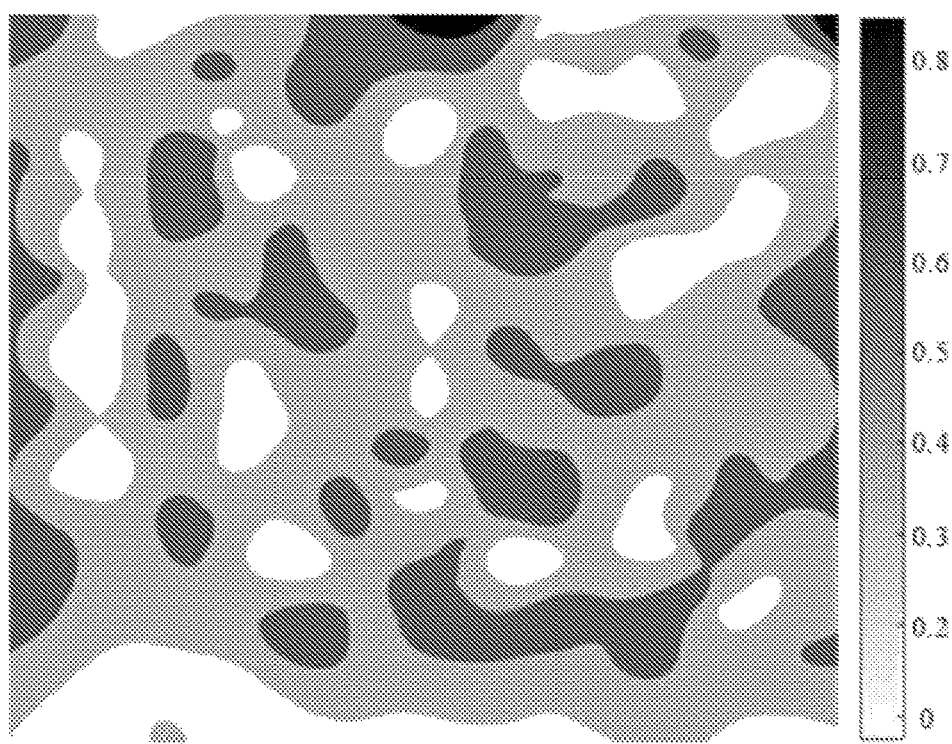
FIG. 11 shows prediction results obtained by the electricity-related security awareness method according to Embodiment 11 of the present disclosure, where the rainfall duration is 12 h; the rainfall intensity is 100 mm/h; and the leakage current exceeds 300 mA at each site in the test area.

Finally, according to the risk probability values of the grids, an electricity-related risk probability distribution map is made (as shown in FIGS. 9-11), where the points in FIGS. 9-11 represent the actual geographical position of the test area, and the rainfall duration is set at 12 h in FIGS. 9 and 11, and 24 h in FIG. 10. The numerical values on the right bar represent the electricity-related security risk values. The color corresponds to 0-1 from light to dark, that is, the darker the color, the greater the probability of the leakage current exceeding the critical value. The areas sharing the same color depth in the heat map have the same electricity-related security risk.

It can be concluded from the above results that the longer the rainfall duration and the greater the rainfall intensity, the larger the area with a dark color, that is, the larger the geographical area with a leakage current exceeding 300 mA.

Based on the generated risk probability distribution map, those areas with a relatively large electricity-related risk probability (greater than 0.7) are located, and further, the DPSPSSs within these areas are located. Early warning information including locations of these DPSPSSs is sent through communication network to the related department, such that corresponding measures can be taken in advance to avoid the occurrence of electricity-related security accidents.

Based on the above methods, the electricity-related security risk distribution map of the DPSPSSs in the rainstorm area can be generated according to the predicted meteorological data, so as to realize the risk early warning and avoid electric shock and other electricity-related security accidents.

The embodiments of the disclosure are described above in conjunction with the accompanying drawings, but the disclosure is not limited to the above-mentioned embodiments. Described above are merely indicative and non-restrictive. Any modifications and replacements made by those skilled in the art without departing from the spirit of the disclosure should fall within the scope of the disclosure defined by the appended claims.

What is claimed is:

1. A method for electricity-related security awareness of distributed power supply systems considering spatio-temporal distribution of rainstorms, comprising:
   (a) deriving a multi-dimensional parallel parasitic capacitance analysis model of a distributed photovoltaic-energy storage power supply system (DPSPSS) considering accumulated water depth and micro-terrain environment, to establish a leakage current calculation model of the DPSPSS under rainstorm conditions;
   (b) collecting and preprocessing a dataset; dividing the dataset into a support set, a query set, a training set and a test set; wherein the dataset includes an input parameter and an output parameter; the input parameter comprises a characteristic parameter of spatio-temporal distribution of rainstorm and a micro-terrain characteristic parameter of a location of the photovoltaic-energy storage power supply system; the output parameter comprises model fitting parameters and micro-terrain fitting parameters; the characteristic parameter of spatio-temporal distribution of rainstorm comprises rainfall peak position, cloud movement, rainfall intensity, and rainfall duration; and the micro-terrain characteristic parameter includes a roof length, a roof width, a roof inclination angle, a roof drainage rate, photovoltaic installation per unit area, a photovoltaic installation inclination angle, and energy storage battery installation per unit area;
   (c) performing spatio-temporal correlation analysis between a characteristic parameter of spatio-temporal distribution of rainstorm of a to-be-tested area and characteristic parameters of spatio-temporal distribution of rainstorms of surrounding areas; and selecting a characteristic parameter of spatio-temporal distribution of rainstorm of a surrounding area with high correlation followed by adding to a sample of the to-be-tested area to train the leakage current calculation model; and
   (d) establishing a leakage current probability prediction model of the DPSPSS considering nonuniformity and randomness of spatio-temporal distribution of rainstorm; and performing leakage current risk perception in the to-be-tested area through the leakage current calculation model and the leakage current probability prediction model;

wherein the step (d) comprises:

establishing an electricity-related security awareness model of the DPSPSS based on deep meta-learning;

with the dataset as a training sample, dividing the training sample into different subtask samples according to spatio-temporal distribution; and pre-training the electricity-related security awareness model by using the subtask samples;

updating weight parameters and bias parameters of a training model according to spatio-temporal correlation of weight parameters and bias parameters obtained by pre-training;

training the training model based on the weight parameters and bias parameters obtained by pre-training to obtain the leakage current probability prediction model; and according to the leakage current calculation model, obtaining a critical water depth corresponding to individual leakage current levels of the DPSPSS in the to-be-tested area; and inputting the critical water depth into the leakage current probability prediction model to identify a spatio-temporal distribution of electricity-related security risks of the DPSPSS in the to-be-tested area;

the step (a) comprises:

(a1) deriving the multi-dimensional parallel parasitic capacitance analysis model; and (a2) based on the multi-dimensional parallel parasitic capacitance analysis model, establishing the leakage current calculation model;

wherein the step (a1) comprises:

(a11) obtaining a first parasitic capacitance model considering a depth of accumulated water on a surface of a photovoltaic cell and a depth of accumulated water between the photovoltaic cell and a first frame, wherein calculation formulas of the first parasitic capacitance model are listed as follows:

$$C'_f = (2L_P + 2W_P - 4L_e) \cdot C_f \cdot \frac{S_P - S_w}{S_p} + \frac{C'_b \cdot C'_E}{C'_b + C'_E};$$

$$C_f = C_1 + C_2 + C_3 + C_4 + C_5;$$

$$C_1 = \frac{\varepsilon_0 \varepsilon_b}{\pi} \ln\left(1 + \frac{W_1}{a_{c1} + b_{c1}}\right) + \frac{\varepsilon_0 \varepsilon_b}{\pi} \ln\left(2k_{c1}\sqrt{k_{c1}^2 - 1} + 2k_{c1} - 1\right);$$

$$a_{c1} = T_{s1} + T_b + T_E;$$

$$b_{c1} = H_t;$$

$$k_{c1} = 1 + \frac{H_t}{T_{s1} + T_b + T_E};$$

-continued $$C_2 = \frac{\varepsilon_0 \varepsilon_b}{\pi} \ln\left(2k_{c2}\sqrt{k_{c2}^2 - 1} + 2k_{c2} - 1\right);$$

$$k_{c2} = 1 + \frac{L_e}{L_s + W_3};$$

$$C_3 = \frac{\varepsilon_0 \varepsilon_a}{\pi} \ln\left(2k_{c31}\sqrt{k_{c31}^2 - 1} + 2k_{c31} - 1\right) + \frac{\varepsilon_0 \varepsilon_a}{\pi} \ln\left(2k_{c32}\sqrt{k_{c32}^2 - 1} + 2k_{c32} - 1\right);$$

$$k_{c31} = 1 + \frac{H_P}{T_E + T_e + T_{s1}};$$

$$k_{c32} = 1 + \frac{H_t}{T_E + T_e + T_{s1}};$$

$$C_4 = \frac{\varepsilon_0 \varepsilon_{qs1}}{\pi} \ln\left(2k_{c4}\sqrt{k_{c4}^2 - 1} + 2k_{c4} - 1\right);$$

$$\varepsilon_{qs1} = \frac{d_{w1}}{H_4}\varepsilon_w + \frac{H_4 - d_{w1}}{H_4}\varepsilon_a;$$

$$k_{c4} = 1 + \frac{L_e}{L_s};$$

$$C_5 = \frac{\frac{\varepsilon_0 \varepsilon_a W_5}{a_{c5} - d_{w1}} \cdot \frac{\varepsilon_0 \varepsilon_w W_5}{d_{w1}}}{\frac{\varepsilon_0 \varepsilon_a W_5}{a_{c5} - d_{w1}} + \frac{\varepsilon_0 \varepsilon_w W_5}{d_{w1}}};$$

$$a_{c5} = T_E + T_e + T_{s1} + H_t + H_4;$$

$$C'_b = \frac{\varepsilon_0 \varepsilon_b S_w}{T_b};$$

$$C'_E = \frac{\varepsilon_0 \varepsilon_E S_w}{T_E}; \text{ and}$$

$$S_P = L_P \cdot W_P;$$

wherein $C_f^r$ is a capacitance between the photovoltaic cell and a frame assembly under the rainstorm conditions; $C_f$ is a parasitic capacitance between the photovoltaic cell and the frame assembly without considering the accumulated water on the surface of the photovoltaic cell; the frame assembly comprises the first frame, a second frame, a third frame, a fourth frame, and a fifth frame; $C_1$ is a parasitic capacitance between the photovoltaic cell and the fifth frame; $C_2$ is a parasitic capacitance between the photovoltaic cell and the second frame; $C_3$ is a parasitic capacitance between the photovoltaic cell and the third frame; $C_4$ is a parasitic capacitance between the photovoltaic cell and the fourth frame; $C_5$ is a parasitic capacitance between the photovoltaic cell and the first frame; $\varepsilon_0$ is absolute permittivity; $\varepsilon_a$ represents relative permittivity of air; $\varepsilon_b$ represents relative permittivity of glass; $\varepsilon_w$ represents relative permittivity of water; $\varepsilon_E$ represents relative permittivity of an ethyl vinyl acetate (EVA) layer; $T_e$ is a thickness of a Tedlar layer; $T_{s1}$ is a distance between the fifth frame and the glass; $T_b$ is a thickness of the glass; $T_E$ is a thickness of the EVA layer; $H_t$ represents a thickness of the first frame, the second frame, the third frame, the fourth frame, or the fifth frame; $L_e$ is an effective length of a frame capacitor; $L_s$ is a distance from the photovoltaic cell to the third frame; $W_1$ is a length of the fifth frame; $W_3$ is a length of the third frame; $W_5$ is a length of the first frame overlapping with the photovoltaic cell; $H_p$ is a thickness of the photovoltaic cell; $H_4$ is a length of the fourth frame; $S_p$ is an area of the photovoltaic cell; $S_w$ is an area of the accumulated water on the surface of the photovoltaic cell; $C_b'$ is a capacitance between the EVA layer and the accumulated water on the surface of the photovoltaic cell; $C_E'$ is a capacitance between the photovoltaic cell and the glass when there is accumulated water on the surface of the photovoltaic cell; $L_p$ is a length of the photovoltaic cell; $W_p$ is a width of the photovoltaic cell; and $d_{w1}$ is the depth of the accumulated water between the first frame and the photovoltaic cell;

(a12) obtaining a second parasitic capacitance model considering a depth of accumulated water between the photovoltaic cell and a support frame, wherein calculation formulas of the second parasitic capacitance model are listed as follows:

$$C_r^r = \frac{(2L_P + 2W_P - 8W_r)C_{2E} \cdot C_{2e} \cdot C'_{2A} \cdot C_{2w}}{C_{r1} + C_{r2} + C_{r3} + C_{r4}};$$

$$C_{r1} = C_{2E} \cdot C_{2e} \cdot C'_{2A};$$

$$C_{r2} = C_{2E} \cdot C_{2e} \cdot C_{2w};$$

$$C_{r3} = C_{2E} \cdot C'_{2A} \cdot C_{2w};$$

$$C_{r4} = C_{2e} \cdot C'_{2A} \cdot C_{2w};$$

$$C_{2E} = \frac{\varepsilon_0 \varepsilon_E W_r}{T_E};$$

$$C_{2e} = \frac{\varepsilon_0 \varepsilon_e W_r}{T_e};$$

$$C'_{2A} = \frac{\varepsilon_0 \varepsilon_a W_r}{T_A - d_{w2}}; \text{ and}$$

$$C_{2w} = \frac{\varepsilon_0 \varepsilon_w W_r}{d_{w2}};$$

wherein $d_{w2}$ is the depth of the accumulated water between the photovoltaic cell and the support frame; $C_r^r$ is a parasitic capacitance between the photovoltaic cell and the support frame under the rainstorm conditions; $C_{2E}$ is a capacitance between a portion of the photovoltaic cell coinciding with the support frame and the Tedlar layer; $C_{2e}$ is a capacitance between the EVA layer of a portion of the photovoltaic cell coinciding with support frame and an air layer; $C_{2A}'$ is a capacitance between the Tedlar layer and the air layer when there is accumulated water between the support frame and the photovoltaic cell; $C_{2w}$ is a capacitance between the air layer on the portion of the photovoltaic cell coinciding with the support frame and the support frame when there is accumulated water between the support frame and the photovoltaic cell; $\varepsilon_e$ is a relative permittivity of the Tedlar layer; $W_r$ is a width of the support frame; and $T_A$ is a thickness of the air layer between the Tedlar layer and the support frame;

(a13) obtaining a third parasitic capacitance model considering a depth of accumulated water between the photovoltaic cell and ground, wherein calculation formulas of the third parasitic capacitance model are listed as follows:

$$C_g^r = \frac{L_P \cdot C_E \cdot C_e \cdot C'_A \cdot C_{2w}}{C_{g1} + C_{g2} + C_{g3} + C_{g4}} + (2L_P + 2W_P - 4L_e)C_{rt};$$

$$C_{g1} = C_E \cdot C_e \cdot C'_A;$$

$$C_{g2} = C_E \cdot C_e \cdot C_{3w};$$

$$C_{g3} = C_E \cdot C'_A \cdot C_{3w};$$

-continued $$C_{g4} = C_E \cdot C'_A \cdot C_{3w};$$

$$C'_A = \frac{\varepsilon_0 \varepsilon_a W_P}{z - d_{w3}};$$

$$C_{3w} = \frac{\varepsilon_0 \varepsilon_w W_P}{d_{w3}};$$

$$C_{rt} = \frac{\varepsilon_0 \varepsilon_{qs3}}{\pi} \ln\left(1 + \frac{L_e}{T_E + T_e + z + H_P}\right); \text{ and}$$

$$\varepsilon_{qs3} = \frac{d_{w3}}{T_E + T_e + z + H_P}\varepsilon_w + \frac{T_E + T_e + z + H_P - d_{w3}}{T_E + T_e + z + H_P}\varepsilon_a;$$

wherein $d_{w3}$ is the depth of the accumulated water between the photovoltaic cell and the ground; $C_g^r$ is a capacitance between the photovoltaic cell and the ground under the rainstorm conditions; $C_E$ is the capacitance between the photovoltaic cell and the Tedlar layer; $C_e$ is a capacitance between the EVA layer and the air layer; $C_A'$ is a capacitance between the Tedlar layer and the ground when there is accumulated water between the photovoltaic cell and the ground; $C_{3w}$ is a capacitance between the air layer between the photovoltaic cell and the ground and the accumulated water on the ground; $C_{rt}$ is a capacitance between a top of the photovoltaic cell and the accumulated water; and z is a distance between the Tedlar layer and the ground;

(a14) obtaining a fourth parasitic capacitance model considering a depth of accumulated water between an energy storage battery and the ground, wherein calculation formulas of the fourth parasitic capacitance model are listed as follows:

$$C_e^r = C_{et}^r + C_{es}^r + C_{en}^r;$$

$$C_{et}^r = W_{es}\frac{\varepsilon_{qs4}}{\pi}\ln\left(1 + \frac{L_{es}}{a_{es} + b_{es}}\right);$$

$$\varepsilon_{qs4} = \frac{d_{w4}}{a_{es} + b_{es}}\varepsilon_w + \frac{a_{es} + b_{es} - d_{w4}}{a_{es} + b_{es}}\varepsilon_a;$$

$$C_{es}^r = W_{es}\frac{\varepsilon_{qs4}}{\pi}\ln\left(2k_{es}\sqrt{k_{es}^2 - 1} + 2k_{es} - 1\right);$$

$$k_{es} = 1 + \frac{b_{es}}{a_{es}}; \text{ and}$$

$$C_{en}^r = W_{es}\frac{\frac{\varepsilon_a L_{es}}{a_{es} - d_{w4}} \cdot \frac{\varepsilon_w L_{es}}{d_{w4}}}{\frac{\varepsilon_a L_{es}}{a_{es} - d_{w4}} + \frac{\varepsilon_w L_{es}}{d_{w4}}};$$

wherein $C_e^r$ is a parasitic capacitance between the energy storage battery and the ground under the rainstorm conditions; $C_{et}^r$ is a parasitic capacitance between a top of the energy storage battery and the ground; $C_{es}^r$ is a parasitic capacitance between a side of the energy storage battery and the ground; $C_{en}^r$ is a parasitic capacitance between a bottom of the energy storage battery and the ground; $d_{w4}$ is a depth of the accumulated water between the energy storage battery and the ground; $L_{es}$ is a length of the top of the energy storage battery; $a_{es}$ is a distance between the energy storage battery and the ground; $b_{es}$ is a height of the side of the energy storage battery; and $W_{es}$ is a width of the energy storage battery;

the step (a2) comprises:

(a21) obtaining a high-frequency common-mode leakage current generated between the photovoltaic cell or the energy storage battery and the ground, expressed as:

$$i_{c1} = i_{c2} = C_{P1}\frac{dU_{P1}}{dt} = C_{P2}\frac{dU_{P2}}{dt};$$

wherein $C_{P1}$ is an equivalent parasitic capacitance between a positive end of the photovoltaic cell or the energy storage battery and the ground; $C_{P2}$ is an equivalent parasitic capacitance between a negative end of the photovoltaic cell or the energy storage battery and the ground; $i_{c1}$ and $i_{c2}$ are both leakage currents; $U_{P1}$ is a voltage of $C_{P1}$; and $U_{P2}$ is a voltage of $C_{P2}$; and (a22) based on an expression of the high-frequency common-mode leakage current in combination with the first parasitic capacitance model, the second parasitic capacitance model, the third parasitic capacitance model, and the fourth parasitic capacitance model, establishing the leakage current calculation model, and obtaining an accumulated water depth $d_P$ when a leakage current of the DPSPSS exceeds $i_{Le}$.

2. The method of claim 1, wherein the step (c) comprises:

(c1) performing a time series-based temporal correlation analysis on the input parameter through the following formulas:

$$C(R_a, R_b) = \frac{\text{cov}(R_a, R_b)}{\sigma(R_a)a(R_b)};$$

$$R_a = [r_{a1}, r_{a2}, \ldots, r_{aN}]; \text{ and}$$

$$R_b = [r_{b1}, r_{b2}, \ldots, r_{bN}];$$

wherein $R_a=[r_{a1}, r_{a2}, \ldots, r_{aN}]$ and $R_b=[r_{b1}, r_{b2}, \ldots, r_{bN}]$ represent values of the input parameter at different moments; $C(R_a, R_b)$ is a correlation coefficient between $R_a$ and $R_b$; $\text{cov}(R_a, R_b)$ is a covariance of $R_a$ and $R_b$; $\sigma(R_a)$ is a variance of $R_a$; and $\sigma(R_b)$ is a variance of $R_b$; and (c2) performing a geographic information-based spatial correlation analysis on the input parameter through the following formulas:

$$C(R_c, R_d) = \frac{\text{cov}(R_c, R_d)}{\sigma(R_c)a(R_d)};$$

$$R_c = [r_{c1}, r_{c2}, \ldots, r_{cN}]; \text{ and}$$

$$R_d = [r_{d1}, r_{d2}, \ldots, r_{dN}];$$

wherein $R_c=[r_{c1}, r_{c2}, \ldots, r_{cN}]$ and $R_d=[r_{d1}, r_{d2}, \ldots, r_{dN}]$ are values of the input parameter at different moments; $C(R_c, R_d)$ is a correlation coefficient of $R_c$ and $R_d$; $\text{cov}(R_e, R_d)$ is a covariance of $R_e$ and $R_d$; $\sigma(R_e)$ is a variance of $R_c$; and $\sigma(R_d)$ is a variance of $R_d$.

3. The method of claim 2, wherein the step (d) further comprises:

obtaining a probability density function of the rainfall intensity, expressed as:

$$F(y_r) = \frac{\left[\frac{(t_r+C_r)^A}{D_r} y_r\right]^{\frac{1}{B_r}}}{B_r y_r};$$

wherein $A_r$, $B_r$, $C_r$, and $D_r$ are the model fitting parameters which are obtained by fitting historical data; $t_r$ is a predicted rainfall duration; and $y_r$ is the rainfall intensity;

according to rainfall spatio-temporal distribution characteristics and micro-terrain factors of different users, improving the probability density function to obtain a relationship between leakage probability of the DPSPSS and the accumulated water depth, expressed as:

$$y_r'' = (y_r' L_r W_r \cos\varphi_r - V_r) \cdot t_r; \text{ and}$$

$$y_r' = y_r^t k_t k_c;$$

wherein $y_r^t$ is a rainfall intensity of rainfall peak; $y_r'$ is an equivalent rainfall intensity which is a rainfall intensity in a specific area obtained according to the rainfall intensity of the rainfall peak; $y_r''$ is the accumulated water depth; $k_t$ is a fitting coefficient of the rainfall peak position; $k_c$ is a fitting coefficient of the cloud movement; $L_r$ is a fitting parameter to characterize the roof length; $W_r$ is a fitting parameter to characterize the roof width; $\varphi_r$ is a fitting parameter to characterize the roof inclination angle; $V_r$ is a fitting parameter to characterize the roof drainage rate; and $k_t$, $k_c$, $L_r$, $W_r$, $\varphi_r$, and $V_r$ are the micro-terrain fitting parameters;

obtaining a leakage current probability distribution function, expressed as:

$$F'(y_r') = \frac{\left[\frac{(t_r+C_r)^A}{D_r}(y_r' L_r W_r \cos\varphi_r - V_r) \cdot t_r\right]^{\frac{1}{B_r}}}{B_r(y_r' L_r W_r \cos\varphi_r - V_r) \cdot t_r};$$

based on the leakage current probability distribution function, deriving the leakage current calculation model, wherein when the leakage current of the DPSPSS exceeds $i_{Le}$, a probability calculation model is expressed as follows:

$$P_r = 1 - \int_{-\infty}^{\frac{d_p L_r W_r}{t_r}+V_r} F'(y_r') d(y_r');$$

wherein $d_P$ represents the accumulated water depth when the leakage current of the DPSPSS exceeds $i_{Le}$;

establishing the electricity-related security awareness model based on deep meta-learning; and integrating classification results of a classifier module of a light gradient boosting machine (LGBM) with output results of a deep dense neural network to output a prediction result of an operating state of the DPSPSS, expressed as:

$$W_{fg}^{(s)} = W_{fg}^{(s)} - \alpha \frac{\alpha}{\alpha W_{fg}^{(s)}} L(W, b); \text{ and}$$

$$b_f^{(s)} = b_f^{(s)} - \alpha \frac{\alpha}{\alpha b_f^{(s)}} L(W, b);$$

wherein O is the prediction result of the operating state of the DPSPSS; $P_j$ represents a j-th output result of the deep dense neural network; $G_e$ represents an e-th output result of the classifier module of the LGBM; m is number of samples; and input data of the classifier module of the LGBM is preprocessed characteristic parameters of spatio-temporal distribution of rainstorm;

wherein weights and biases in the deep dense neural network are updated in a gradient descent manner, and update rules are expressed as follows:

$$O = \overset{m}{\underset{j=1,e=1}{a}} P_j G_e;$$

wherein $w_{fg}^{(s)}$ represents a weight from a g-th neuron of a (s−1)-th layer to a f-th neuron of a s-th layer in the deep dense neural network; $b_f^{(s)}$ represents a bias of the f-th neuron of the s-th layer in the deep dense neural network; $\alpha$ represents learning rate; and L(W, b) is a loss function which is expressed as follows:

$$L(W, b) = \frac{1}{N}\sum_{k=1}^{N}\frac{1}{2}\left\|h_{W,b}(x^{(k)}) - y^{(k)}\right\|^2;$$

wherein N is the number of samples in a training set; $x^{(k)}$ represents an input of a k-th sample of the training set in the deep dense neural network; $h_{W,b}(x)$ is a forward propagation function; and $y^{(k)}$ is a label of the k-th sample in the training set;

training the electricity-related security awareness model o by deep meta-learning;

dividing the support set and the query set in the dataset into t subtask samples according to data in t different regions;

training the t subtask samples separately to obtain a corresponding weight parameter $W_t$ and a corresponding bias parameter $b_t$;

updating the weight parameters $W_m$ and bias parameters $b_m$ in the electricity-related security awareness model by soft update every time one of the t subtask samples is trained, wherein the soft update is expressed as follows:

$$W_{m(t)} = (1-t\tau)W_{m(t-1)} + \tau(c_{w1}W_1 + c_{w2}W_2 + \ldots + c_{wt}W_t);$$
and $$b_{m(t)} = (1-t\tau)b_{m(t-1)} + \tau(C_{w1}b_1 + c_{w2}b_2 + \ldots + c_{wt}b_t);$$

wherein $W_{m(t)}$ is a weight parameter of the training model obtained after a t-th subtask sample is trained; $b_{m(t)}$ is a bias parameter of the training model obtained after the t-th subtask sample is trained; $W_{m(t-1)}$ is a weight parameter of the training model obtained after a (t−1)-th subtask sample is trained; $b_{m(t-1)}$ is a bias parameter of the training model obtained after the (t−1)-th subtask sample is trained; $\tau$ is a soft update coefficient, and equals to 0.05; $W_1$, $W_2$, ..., and $W_t$ are weight parameters of the t subtask samples, respectively; $b_1$, $b_2$, ..., and $b_t$ are bias parameters of the t subtask samples, respectively; and $c_{w1}$, $c_{w2}$, ..., and $c_{wt}$ are correlation coefficients obtained by the spatio-temporal correlation analysis;

assigning the weight parameters $W_m$ and the bias parameters $b_m$ obtained by pre-training to the training model; and inputting the training set into the training model for training; outputting the model fitting parameters and the micro-terrain fitting parameters, so as to obtain the leakage current probability prediction model in different regions at different moments; and plugging the critical water depth obtained according to the leakage current calculation model into the leakage current probability prediction model, so as to identify the spatio-temporal distribution range of electricity-related security risks of the DPSPSS.

\* \* \* \* \*